US012658909B2

(12) United States Patent
Onda et al.

(10) Patent No.: US 12,658,909 B2
(45) Date of Patent: Jun. 16, 2026

(54) SEMICONDUCTOR DRIVE DEVICE AND POWER CONVERSION DEVICE COMPRISING SAME

(71) Applicant: Mitsubishi Electric Corporation, Tokyo (JP)

(72) Inventors: Kohei Onda, Tokyo (JP); Naohiko Mitomi, Tokyo (JP); Kazuhiro Otsu, Tokyo (JP); Junichiro Ishikawa, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 210 days.

(21) Appl. No.: 18/684,846

(22) PCT Filed: Aug. 31, 2021

(86) PCT No.: PCT/JP2021/031863
§ 371 (c)(1),
(2) Date: Feb. 20, 2024

(87) PCT Pub. No.: WO2023/032024
PCT Pub. Date: Mar. 9, 2023

(65) Prior Publication Data
US 2025/0132757 A1 Apr. 24, 2025

(51) Int. Cl.
*H03K 17/0812* (2006.01)
*H02M 1/00* (2006.01)
(Continued)

(52) U.S. Cl.
CPC .... *H03K 17/08128* (2013.01); *H02M 1/0038* (2021.05); *H02M 1/08* (2013.01);
(Continued)

(58) Field of Classification Search
CPC ........ H02M 1/0038; H02M 1/08; H02M 1/32; H02M 7/5387; H02M 3/158; H02H 9/025; H03K 17/08148
See application file for complete search history.

(56) References Cited

U.S. PATENT DOCUMENTS 11,070,046 B2 7/2021 Naka et al.
11,139,808 B2 10/2021 Yoshida et al.
(Continued)

FOREIGN PATENT DOCUMENTS

EP 2615737 A1 7/2013
JP H02-37828 A 2/1990
(Continued)

OTHER PUBLICATIONS

Japanese Office Action issued Oct. 8, 2024, in corresponding Japanese Patent Application JP2023-544829, 5pp.
(Continued)

*Primary Examiner* — Kyle J Moody
(74) *Attorney, Agent, or Firm* — XSENSUS LLP

(57) ABSTRACT

A semiconductor drive device includes a gate drive unit which drives a semiconductor switching element, and an overcurrent protection unit. The overcurrent protection unit includes an overcurrent determination unit which receives a detection signal and determines whether there is overcurrent, and a gate voltage reducing unit which reduces gate-applied voltage when it is determined that there is the overcurrent. The overcurrent determination unit includes a clamp diode for clamping a potential of an input part for the detection signal at a gate potential, a first transistor to which the input part is connected, and a low-pass filter. When the potential of the input part has reached a set value, the first transistor is turned on so that it is determined that there is the overcurrent in the semiconductor switching element.

20 Claims, 18 Drawing Sheets

(51) Int. Cl.

| | | |
|---|---|---|
| *H02M 1/08* | (2006.01) |
| *H02M 1/32* | (2007.01) |
| *H02M 7/5387* | (2007.01) |
| *H02M 3/158* | (2006.01) |

(52) U.S. Cl.
CPC ........... *H02M 1/32* (2013.01); *H02M 7/5387* (2013.01); *H02M 3/158* (2013.01)

(56) References Cited

U.S. PATENT DOCUMENTS

| | | | |
|---|---|---|---|
| 2008/0247099 A1 | 10/2008 | Hojo | |
| 2012/0013370 A1* | 1/2012 | Mori | H03K 17/0828 |
| | | | 327/109 |
| 2019/0372567 A1 | 12/2019 | Yoshida et al. | |
| 2020/0153338 A1* | 5/2020 | Ribarich | H02M 1/08 |
| 2020/0395747 A1 | 12/2020 | Wada et al. | |
| 2023/0308088 A1* | 9/2023 | Iwai | H02M 1/32 |

FOREIGN PATENT DOCUMENTS

| | | | |
|---|---|---|---|
| JP | H07154216 | A | 6/1995 |
| JP | 2005-208949 | A | 8/2006 |
| JP | 5487746 | B2 | 5/2014 |
| JP | 2017-224999 | A | 12/2017 |
| JP | 6351736 | B2 | 7/2018 |
| JP | 2019-022253 | A | 2/2019 |
| JP | 6735900 | B2 | 8/2020 |
| WO | 2018/158807 | A1 | 9/2018 |
| WO | 2019/008817 | A1 | 1/2019 |

OTHER PUBLICATIONS

International Search Report and Written Opinion mailed on Oct. 26, 2021, received for PCT Application PCT/JP2021/031863, filed on Aug. 31, 2021, 8 pages including English Translation.
Office Action issued Jun. 6, 2024 in corresponding Japanese Patent Application No. 2023-544829 with machine English translation.
Korean Office Action dated Jun. 12, 2025 of the corresponding Korean patent application No. KR10-2024-7005376, 12pp.

* cited by examiner

SEMICONDUCTOR DRIVE DEVICE AND POWER CONVERSION DEVICE COMPRISING SAME

CROSS-REFERENCE TO RELATED APPLICATION

This application is based on PCT filing PCT/JP2021/031863, filed Aug. 31, 2021, the entire contents of which are incorporated herein by reference.

TECHNICAL FIELD

The present disclosure relates to a semiconductor drive device and a power conversion device including the same.

BACKGROUND ART

Semiconductor switching elements are applied to various power conversion devices. Among these, in a power conversion device for an elevating machine, an electric railroad, or power equipment, a semiconductor switching element forming a power converter and a semiconductor drive device for performing control therefor may be located apart from each other and connected via long wiring therebetween. In such a case, due to a wiring inductance or noise superimposed on the wiring, it is difficult to detect overcurrent abnormality of the semiconductor switching element, on the semiconductor drive device side.

Accordingly, a semiconductor drive device may be configured such that a board having an overcurrent protection circuit that does not need supply of power is provided just near or directly above the semiconductor switching element.

A short-circuit protection circuit for an insulated gate bipolar transistor (IGBT), which is a conventional semiconductor drive device, includes a gate drive circuit for driving the IGBT, a delay circuit for delaying gate drive signal voltage from a control circuit, a series circuit connected between the delay circuit and a collector terminal of the IGBT and formed of a resistor and a diode having a cathode on the collector side, a detection circuit for detecting voltage on the anode side of the diode, and an interruption circuit which forcibly turns off the IGBT when a detection value of the detection circuit has become a predetermined value or greater. Then, the interruption circuit has such a circuit configuration that turns on a transistor for which a constant-voltage diode is connected to a control terminal, a reverse block diode is connected to a collector terminal, and a reverse voltage prevention diode is connected between an emitter and a cathode of the constant-voltage diode, thereby interrupting a gate drive signal from the control circuit (for example, Patent Document 1).

CITATION LIST

Patent Document

Patent Document 1: Japanese Patent No. 5487746

SUMMARY OF THE INVENTION

Problem to be Solved by the Invention

The conventional semiconductor drive device includes an overcurrent protection circuit for performing protection by detecting overcurrent abnormality of a semiconductor switching element using threshold voltage of the transistor, without needing supply of power.

However, since overcurrent abnormality is detected through comparison with threshold voltage of the transistor, noise resistance is reduced. In particular, when the semiconductor switching element performs ON/OFF operation, overcurrent is transitionally likely to be erroneously detected. Although erroneous detection at the time of ON operation can be prevented through delay operation of the delay circuit, a risk of erroneous detection at the time of OFF operation increases conversely.

The present disclosure has been made to solve the above problem and an object of the present disclosure is to provide a semiconductor drive device that can perform overcurrent protection in which overcurrent of a semiconductor switching element is detected to perform protection, without needing supply of power, while preventing erroneous operation due to noise, and thus can drive the semiconductor switching element with high reliability.

Another object of the present disclosure is to provide an inexpensive and highly reliable power conversion device that includes a power converter having a semiconductor switching element driven by the above-described semiconductor drive device, and can perform overcurrent protection for the semiconductor switching element with high reliability even in a case where the semiconductor switching element and a gate drive unit of the semiconductor drive device are located apart from each other.

Means to Solve the Problem

A semiconductor drive device according to the present disclosure includes: a gate drive unit which applies voltage to a control terminal of a semiconductor switching element, to perform ON/OFF driving of the semiconductor switching element; and an overcurrent protection unit including an overcurrent determination unit which receives a detection signal based on voltage/current between main terminals of the semiconductor switching element and determines whether there is overcurrent flowing through the semiconductor switching element, and a gate voltage reducing unit which reduces voltage applied to the control terminal when it is determined that there is the overcurrent, thus protecting the semiconductor switching element. The overcurrent determination unit includes a clamp diode for clamping a potential of a signal input part where the detection signal is inputted, at a potential of the control terminal, a first transistor to which the signal input part is connected, and a low-pass filter provided at the signal input part. When a potential of the signal input part has reached a set value, the first transistor is turned on, so that the overcurrent determination unit determines that there is the overcurrent in the semiconductor switching element.

A power conversion device according to the present disclosure includes: a power converter including at least one leg circuit formed by connecting, in series, an upper arm and a lower arm each having the semiconductor switching element; and the above semiconductor drive device provided for each of the semiconductor switching elements, to drive the semiconductor switching element.

Effect of the Invention

The semiconductor drive device according to the present disclosure can perform overcurrent protection in which overcurrent of a semiconductor switching element is detected to perform protection, without needing supply of power, while preventing erroneous operation due to noise, and thus can drive the semiconductor switching element with high reliability.

The power conversion device according to the present disclosure makes it possible to provide an inexpensive and highly reliable power conversion device that can perform, with high reliability, overcurrent protection for a semiconductor switching element even in a case where the semiconductor switching element and a gate drive unit of the semiconductor drive device are located apart from each other.

DESCRIPTION OF EMBODIMENTS

Embodiment 1

Figure 1:
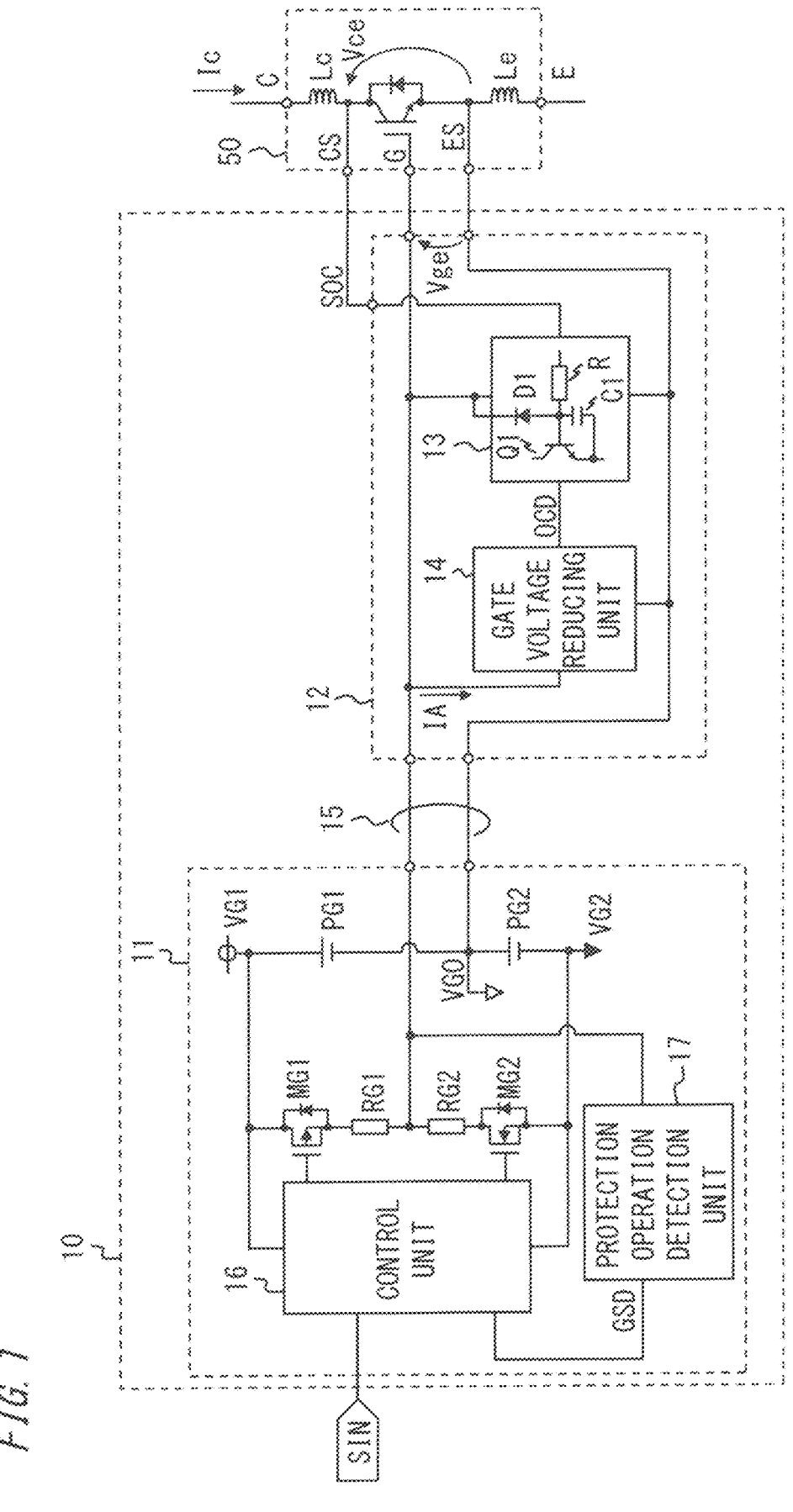
FIG. 1 shows the schematic configuration of a semiconductor drive device according to embodiment 1.

FIG. 1 shows the schematic configuration of a semiconductor drive device according to embodiment 1.

A semiconductor drive device 10 controls a conduction/non-conduction state between a collector C and an emitter E which are main terminals of a semiconductor switching element 50, by gate voltage Vge applied between a control terminal (hereinafter, gate terminal) G and a reference terminal (hereinafter, emitter control terminal) ES.

In this case, an IGBT is shown as an example of the semiconductor switching element 50. However, another semiconductor switching element such as a metal-oxide-semiconductor field-effect transistor (MOSFET) having a control terminal is also applicable.

As shown in FIG. 1, the semiconductor drive device 10 includes a gate drive unit 11 and an overcurrent protection unit 12. The overcurrent protection unit 12 is located just near or directly above the semiconductor switching element 50, and the gate drive unit 11 and the overcurrent protection unit 12 are connected via two lines of connection wiring 15.

The gate drive unit 11 includes: an output stage circuit composed of a positive power supply PG1, a negative power supply PG2, a P-type MOSFET MG1, an N-type MOSFET MG2, and gate resistors RG1, RG2; a control unit 16 for controlling the output stage circuit; and a protection operation detection unit 17. The emitter control terminal ES of the semiconductor switching element 50 is connected to a reference potential VG0 at a connection point between the positive power supply PG1 and the negative power supply PG2.

The control unit 16 receives an ON/OFF command signal (hereinafter, command signal) SIN transmitted from a host control device (not shown), and controls an output stage circuit on the basis of a signal GSD from the protection operation detection unit 17. Besides the signal GSD, the control unit 16 may logically combine a kind of abnormality detection signal indicating excessive temperature, power supply reduction, or the like, to control the output stage circuit. Operation of the protection operation detection unit 17 will be described later.

Here, a configuration in which the output stage circuit outputs the positive power supply potential VG1 or the negative power supply potential VG2 is shown as an example. However, a configuration in which the negative power supply PG2 is not used, i.e., the negative power supply potential VG2 is equal to the reference potential VG0, may be adopted. Here, as an output stage buffer of the gate drive unit 11, the P-type MOSFET MG1 and the N-type MOSFET MG2 are used and the switching speeds are adjusted by the gate resistors RG1, RG2, thus implementing constant-voltage driving. However, the present disclosure is not limited thereto.

The overcurrent protection unit 12 includes an overcurrent determination unit 13 which determines whether there is overcurrent flowing through the semiconductor switching element 50, and a gate voltage reducing unit 14 which reduces voltage applied to the gate terminal G of the semiconductor switching element 50, when it is determined that there is the overcurrent.

The overcurrent determination unit 13 includes a first transistor Q1, a clamp diode D1, and a low-pass filter (R, C1) formed by a resistor R and a capacitor C1. A detection signal SOC based on collector voltage Vce which is voltage between the main terminals of the semiconductor switching element 50 is inputted to the first transistor Q1 via the low-pass filter (R, C1), and a determination signal OCD for overcurrent is outputted.

In this case, when the first transistor Q1 is turned on, the determination signal OCD is changed, whereby it is determined that there is overcurrent in the semiconductor switching element 50.

The gate voltage reducing unit 14 receives the determination signal OCD for overcurrent and operates so as to reduce the gate voltage Vge applied to the gate terminal G, to a level lower than voltage (VG1) of the positive power supply PG1. At this time, in the gate drive unit 11, the protection operation detection unit 17 detects that the gate voltage reducing unit 14 has reduced the gate voltage Vge, generates a signal GSD as a detection signal about protection operation, and transmits the signal GSD to the control unit 16.

When the control unit 16 has received the signal GSD, the control unit 16 keeps the semiconductor switching element 50 in an OFF state during a predetermined period, irrespective of the state of a command signal SIN. As a method for the protection operation detection unit 17 to detect protection operation of the gate voltage reducing unit 14, a known method may be used, e.g., such a fact that an output potential or output current of the gate drive unit 11 (output stage circuit) has been reduced to a set value or smaller over a preset period, may be detected. Therefore, the detailed description thereof is omitted.

In this case, the detection signal SOC inputted to the overcurrent determination unit 13 is voltage (collector voltage Vce) of a collector sense terminal CS.

A parasitic inductance Lc between the collector C and the collector sense terminal CS, and a parasitic inductance Le between the emitter E and the emitter control terminal ES, are shown.

Normally, the emitter control terminal ES and the collector sense terminal CS are formed closely to the own element so that a parasitic inductance L interposed on the own element side is minimized. Then, the influence of electromotive voltage (L·dI/dt) due to the parasitic inductance L is eliminated. For the semiconductor switching element 50 used in a large-capacity power module or the like, normally, the emitter control terminal ES is provided so as to prevent reduction in the gate voltage Vge due to the electromotive voltage (L·dI/dt). In addition, in a case of detecting the collector voltage Vce, the collector sense terminal CS is provided so as to detect the collector voltage Vce while preventing extra voltage addition due to the electromotive voltage (L·dI/dt).

In the present embodiment, the case where the emitter control terminal ES and the collector sense terminal CS are provided is shown. However, without providing the emitter control terminal ES and the collector sense terminal CS, the emitter E and the collector C which are main terminals used for connection of the semiconductor switching element 50 with an external element may be used.

The collector voltage Vce in the present embodiment is slightly different from actual voltage between the main terminals (collector C and emitter E), but is voltage (Vce) between the main terminals, to be used for control.

Figure 2:
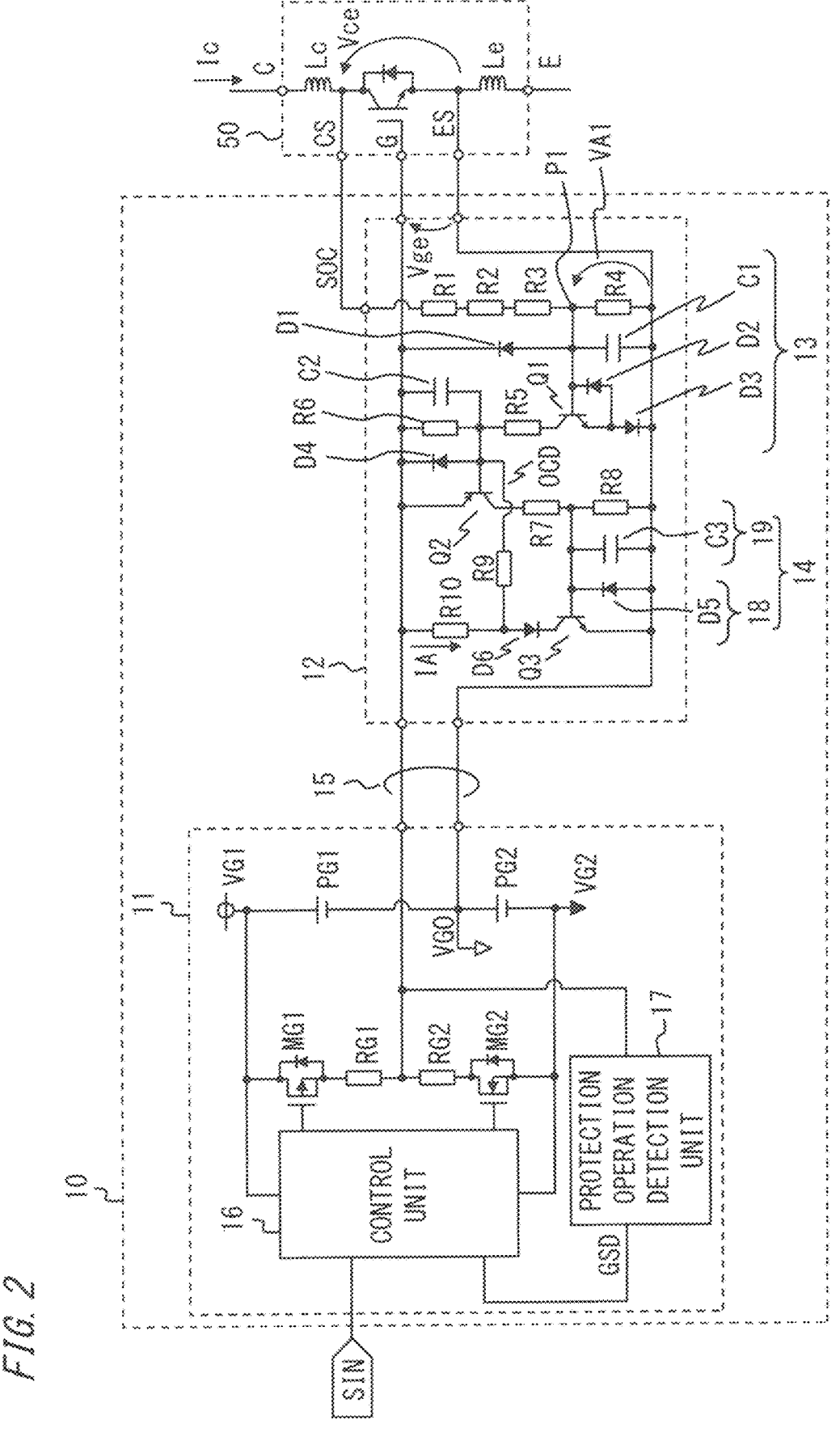
FIG. 2 shows the circuit configuration of the semiconductor drive device according to embodiment 1.

FIG. 2 shows the circuit configuration of the semiconductor drive device according to embodiment 1, and in particular, shows the details of the overcurrent protection unit 12.

As shown in FIG. 2, the overcurrent protection unit 12 includes the overcurrent determination unit 13 which receives a detection signal SOC and outputs a determination signal OCD for overcurrent, and the gate voltage reducing unit 14 which reduces the gate voltage Vge on the basis of the determination signal OCD. The gate voltage reducing unit 14 includes a drive circuit 18 for reducing the gate voltage Vge and an amplification circuit 19 which amplifies an output signal from the overcurrent determination unit 13, to drive the drive circuit 18.

The overcurrent determination unit 13 includes resistors R1, R2, R3, R4 connected in series, a clamp diode D1, and a capacitor C1. Further, the overcurrent determination unit 13 includes a series circuit in which a first transistor Q1 formed from an NPN bipolar transistor, resistors R5, R6, and a reverse flow prevention diode D3 are connected in series. In addition, a capacitor C2 is connected in parallel to the resistor R6, and a protection diode D2 is provided between the base and the emitter of the first transistor Q1.

In this case, the resistor R including three resistors R1, R2, R3 and the capacitor C1 form the low-pass filter (R, C1). A connection point P1 between the resistor R (R1, R2, R3) and the resistor R4 is an input part for the detection signal SOC and is connected to the base of the first transistor Q1. The potential at the connection point P1 which is a base potential of the first transistor Q1, based on the emitter control terminal ES as a reference, is an input potential VA1.

The anode of the clamp diode D1 is connected to the capacitor C1 of the low-pass filter (R, C1), and a connection point therebetween is connected to the connection point P1 and the base of the first transistor Q1.

The detection signal SOC undergoes voltage division by the resistors R1 to R4 and then is inputted to the base of the first transistor Q1 via the low-pass filter (R, C1) formed by the voltage-division resistor R (R1, R2, R3) and the capacitor C1. The base of the first transistor Q1 is clamped at the negative power supply potential VG2 by the clamp diode D1 when the semiconductor switching element 50 is OFF.

In this example, the clamp diode D1 is connected to the output side of the low-pass filter (R, C1), but may be connected to the input side of the low-pass filter (R, C1).

In this case, when the semiconductor switching element 50 is turned off, the gate drive unit 11 negatively biases the gate voltage Vge, so that the base potential and the collector potential of the first transistor Q1 are also negatively biased. Therefore, for element protection of the first transistor Q1, the protection diode D2 and the reverse flow prevention diode D3 are provided.

The protection diode D2 is an antiparallel diode normally used for a bipolar transistor, and prevents a phenomenon in which great negative voltage is applied between the base and the emitter of the first transistor Q1 and thus a characteristic thereof is deteriorated.

The reverse flow prevention diode D3 blocks current from reversely flowing in the conduction direction of the first transistor Q1, to protect the first transistor Q1. In this case, when the first transistor Q1 is OFF, negative voltage is applied to the gate terminal G, and therefore reverse bias between the collector and the emitter of the first transistor Q1 is prevented to perform protection.

The reverse flow prevention diode D3 is provided on the emitter side of the first transistor Q1, and the base potential (input potential VA1) of the first transistor Q1 based on the emitter control terminal ES as a reference can raise a voltage level needed for the first transistor Q1 to turn on. Thus, resistance to noise due to voltage can be improved.

The reverse flow prevention diode D3 may be provided on the collector side of the first transistor Q1.

The junction between the base and the emitter of the bipolar transistor is P-N junction as in a diode. Therefore, base threshold voltage which is base-emitter voltage needed for the bipolar transistor to turn on and the forward direction voltage of the diode are both referred to as Vf, for the purpose of simplification.

In this case, overcurrent is detected through the first transistor Q1 being turned on. When the first transistor Q1 is turned on, the base potential (input potential VA1) is represented by the following Expression (1).

The resistors R7, R8 connected in series to the second transistor Q2 are set in advance so as to satisfy the following expression.

$$VA1 = Vce \times R4/(R1 + R2 + R3 + R4) = 2Vf \qquad \text{Expression (1)}$$

When the semiconductor switching element 50 is turned off, the base potential (input potential VA1) of the first transistor Q1 is negatively biased immediately due to an action of the clamp diode D1. Thus, in OFF operation of the semiconductor switching element 50, erroneous detection for overcurrent due to increase in the collector voltage Vce can be prevented. In addition, the initial state of the capacitor C1 in the low-pass filter (R, C1) is negatively biased, whereby, also in ON operation of the semiconductor switching element 50, erroneous detection for overcurrent during a period until the collector voltage Vce is reduced can be prevented.

Next, the amplification circuit 19 in the gate voltage reducing unit 14 is a circuit for amplifying the determination signal OCD from the overcurrent determination unit 13, and includes a series circuit in which a second transistor Q2 formed from a PNP bipolar transistor and resistors R7, R8 are connected in series. In addition, a capacitor C3 is connected in parallel to the resistor R8, and a protection diode D4 is provided between the base and the emitter of the second transistor Q2. Voltage of the determination signal OCD is applied to the base of the second transistor Q2.

The drive circuit 18 in the gate voltage reducing unit 14 is a circuit for amplifying an output signal from the overcurrent determination unit 13, and includes a series circuit in which a third transistor Q3 formed from an NPN bipolar transistor, a resistor R10, and a diode D6 are connected in series. In addition, a resistor R9 is provided between the series circuit and the base of the second transistor Q2, and a protection diode D5 is provided between the base and the emitter of the third transistor Q3.

When the first transistor Q1 is turned on and thus the semiconductor switching element 50 is determined to be in an overcurrent state, the second transistor Q2 is turned on and further the third transistor Q3 is turned on. Specifically, the following operation is performed.

In a normal ON state of the semiconductor switching element 50, the first transistor Q1 is OFF and therefore the potential of the determination signal OCD, i.e., the base potential of the second transistor Q2, is the same as the gate potential (positive power supply potential VG1) of the semiconductor switching element 50. When the first transistor Q1 is turned on due to occurrence of overcurrent, the potential of the determination signal OCD is reduced, and then, when the potential is reduced to a potential (VG1-Vf) that is lower than the positive power supply potential VG1 by the threshold voltage Vf of the second transistor Q2, the second transistor Q2 is turned on.

The resistors R5, R6 connected in series to the first transistor Q1 are set in advance so as to satisfy the following expression.

$$(VG1 - Vf) \times R6/(R5 + R6) > Vf$$

When the second transistor Q2 is turned on, the collector potential of the second transistor Q2 increases to the positive power supply potential VG1. Thus, the base potential of the third transistor Q3 also increases and voltage not smaller than the threshold voltage Vf is applied to the base of the third transistor Q3, whereby the third transistor Q3 is turned on.

$$VG1 \times R8/(R7 + R8) > Vf$$

As described above, the first transistor Q1, the second transistor Q2, and the third transistor Q3 are sequentially turned on. Then, gate discharge current IA for discharging electric charge in the capacitance (gate electric charge) between the gate and the emitter of the semiconductor switching element 50 flows through the third transistor Q3, to reduce the gate voltage Vge. Thus, overcurrent of the semiconductor switching element 50 can be suppressed.

In the semiconductor switching element 50, as the current capacity increases, the gate input capacity increases. Therefore, in order to reduce the gate voltage Vge of the semiconductor switching element 50 having a large current capacity to perform protection from overcurrent, it is necessary to discharge a large amount of gate electric charge. For example, if the semiconductor switching element 50 has a current capacity of several hundred A, gate discharge current IA at several A needs to flow.

Base current of the first transistor Q1 is determined by constraints for reducing parasitic leakage current (i.e., heat generation) during a period in which the semiconductor switching element 50 is OFF, and therefore the magnitude of collector current of the first transistor Q1 is also constrained. Base current of the first transistor Q1 as parasitic leakage current is approximately 1 mA. Considering a temperature characteristic or a frequency characteristic, current amplification factors of the first transistor Q1 and the third transistor Q3 are approximately 30, for example. If current amplification is performed at two stages without providing the amplification circuit 19, only gate discharge current IA not greater than approximately 1 A can flow.

In this case, the first transistor Q1, the second transistor Q2, and the third transistor Q3 are sequentially turned on, whereby base current is sequentially increased. Thus, by three-stage current amplification, discharge of a large amount of gate electric charge is achieved within a short time. By the three-stage current amplification, for example, gate discharge current IA up to several ten A can be treated.

It is noted that the drive circuit 18 in the gate voltage reducing unit 14 can operate without the amplification circuit 19, and therefore the amplification circuit 19 may be omitted as appropriate.

In general, when the third transistor Q3 is turned on and the gate voltage Vge is reduced, through this operation, the detection signal SOC for overcurrent comes close to a non-overcurrent state, and then, if the operation of reducing the gate voltage Vge is canceled, overcurrent occurs again. Thus, oscillation operation of repeating the above process can occur.

In the present embodiment, the resistor R9 is provided to impart deep hysteresis to overcurrent determination operation, thus preventing the above oscillation operation. That is, when the third transistor Q3 is turned on, the base potential of the second transistor Q2 is reduced due to an action of the resistor R9, so that the overcurrent determination operation is kept during a predetermined time. Thus, the gate voltage reducing unit 14 keeps the operation of reducing the gate voltage Vge, during a predetermined time.

The value of the resistor R10 for prescribing the gate discharge current IA which flows during overcurrent protection operation needs to be set so as to prevent surge voltage that occurs by the gate voltage Vge of the semiconductor switching element 50 being sharply reduced to a value not greater than the gate threshold voltage Vth, and for example, is set so as to satisfy the following Expression (2).

$$(VG1 - VG0) \times R10/(RG1 + R10) > Vth \qquad \text{Expression (2)}$$

In general, a built-in gate resistor is provided in the semiconductor switching element 50. Therefore, in actuality, even in a case where the above Expression (2) is not satisfied, if a period in which the gate voltage Vge is reduced is short, a state in which the gate voltage inside the semiconductor switching element 50 is higher than the gate threshold voltage Vth is kept. Thus, surge voltage might not be a problem.

Meanwhile, when the protection operation detection unit 17 detects protection operation and the control unit 16 is to turn off the semiconductor switching element 50, if the gate voltage Vge that has been reduced through the protection operation is excessively great, sharp current interruption occurs, so that the semiconductor switching element 50 might be deteriorated by surge voltage. Therefore, it is desirable to adjust the value of the resistor R10 so that surge voltage Vsa occurring in the collector voltage Vce during protection operation and surge voltage Vsb occurring in the collector voltage Vce when the semiconductor switching element 50 is turned off thereafter become approximately equal to each other.

Thus, it is possible to omit a so-called soft-interruption function which is a function of increasing a gate resistance when the control unit 16 is to turn off the semiconductor switching element 50 after the protection operation detection unit 17 detects protection operation, as compared to a gate resistance in a normal turn-off case.

Figure 3:
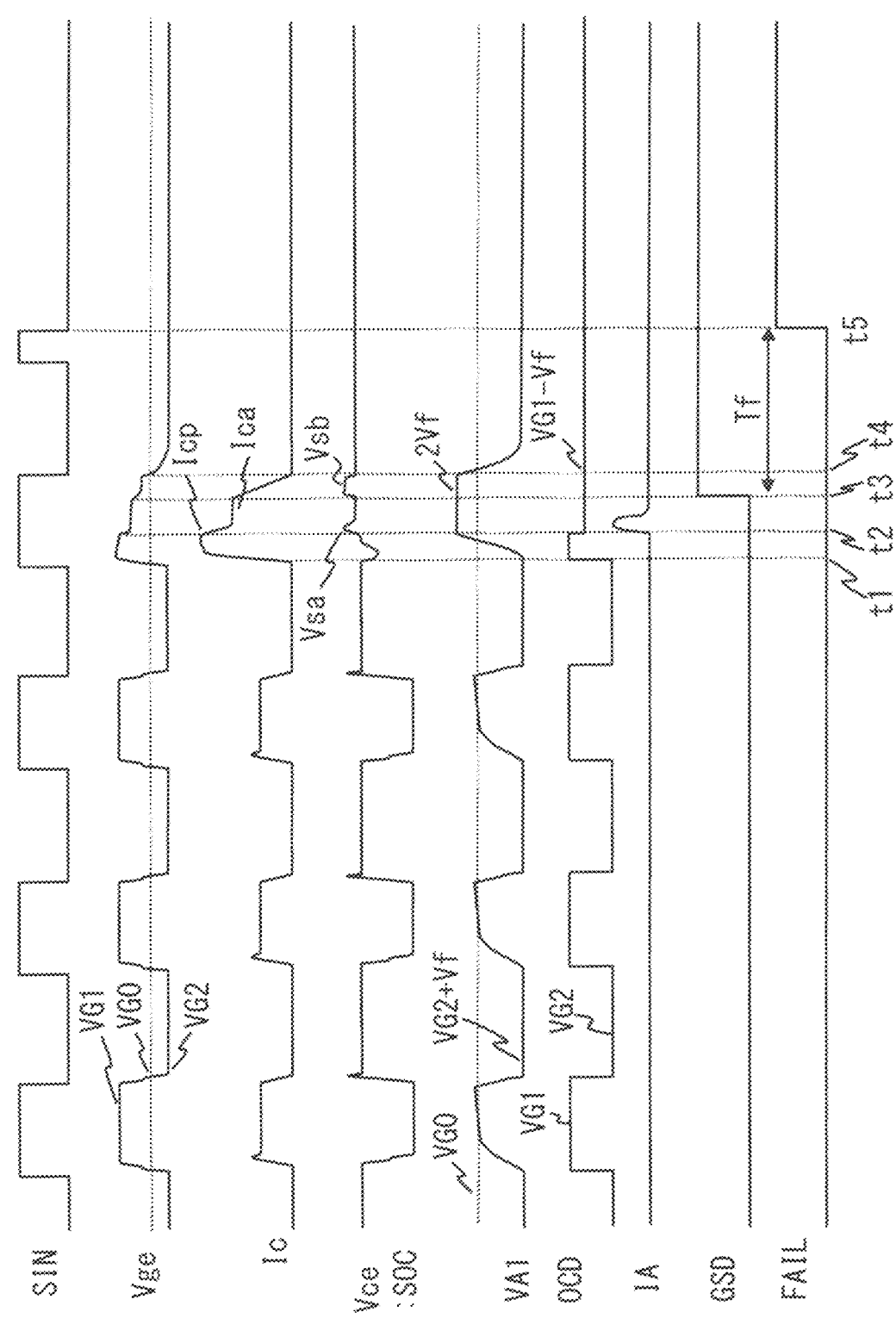
FIG. 3 is a waveform diagram at each part showing operation of the semiconductor drive device according to embodiment 1.

FIG. 3 is a waveform diagram at each part showing operation of the semiconductor drive device according to embodiment 1.

Hereinafter, with reference to FIG. 2 and FIG. 3, the details of overcurrent protection operation by the semiconductor drive device 10 will be described.

In a normal state before time t1, the gate voltage Vge is outputted in accordance with the command signal SIN transmitted from the host control device, so that the collector current Ic of the semiconductor switching element 50 and the collector voltage Vce thereof which becomes the detection signal SOC also have waveforms corresponding to the command signal SIN. When the semiconductor switching element 50 is OFF, the base potential (input potential) VA1 of the first transistor Q1 based on the emitter control terminal ES as a reference is clamped at a potential (VG2+ Vf) obtained by adding the forward-direction voltage Vf of the clamp diode D1 to the negative power supply potential VG2. When the semiconductor switching element 50 is ON, the collector voltage Vce is reduced to several V and the voltage VA1 divided by the resistor R (R1, R2, R3) and the resistor R4 becomes a value close to the reference potential VG0.

The potential of the determination signal OCD, i.e., the base potential of the second transistor Q2, is equal to the gate potential (positive power supply potential VG1) when the semiconductor switching element 50 is ON, and is lowered to the negative power supply potential VG2 when the semiconductor switching element 50 is OFF.

At time t1, after the semiconductor switching element 50 is turned on, when overcurrent occurs due to arm short-circuit with another connected arm, or the like, a peak value Icp of the collector current Ic is saturated and the collector voltage Vce which would be normally reduced becomes high. Thus, the base potential (input potential) VA1 of the first transistor Q1 increases beyond the reference potential VG0.

At time t2, the base potential (input potential) VA1 of the first transistor Q1 becomes 2Vf through increase, i.e., the above Expression (1) is satisfied, so that the first transistor Q1 is turned on. Thus, overcurrent of the semiconductor switching element 50 is detected. When the first transistor Q1 is turned on, the potential of the determination signal OCD is reduced, and then, when the potential is reduced to a potential (VG1–Vf) that is lower than the positive power supply potential VG1 by the threshold voltage Vf of the second transistor Q2, the second transistor Q2 is turned on. Thus, the base potential of the third transistor Q3 increases and voltage not smaller than the threshold voltage Vf is applied to the base, so that the third transistor Q3 is turned on.

Then, the gate discharge current IA flows and the gate voltage Vge is reduced. At this time, the collector current Ic is reduced to a value Ica corresponding to the reduced gate voltage Vge, and along with this, the surge voltage Vsa occurs in the collector voltage Vce.

At time t3, the protection operation detection unit 17 detects reduction in the gate voltage Vge and generates the signal GSD.

During a period from time t3 to time t4, the control unit 16 performs current interruption operation to the semiconductor switching element 50 so as to be turned off. At this time, the surge voltage Vsb occurs in the collector voltage Vce. As described above, it is desirable to set the resistor R10 so as to satisfy the above Expression (2) so that the surge voltage Vsb becomes approximately equal to the surge voltage Vsa which occurs first.

At time t5 after a delay period Tf has elapsed since occurrence of the signal GSD, the command signal SIN from the host control device is kept in an OFF state and an abnormal signal FAIL is generated.

As described above, in the present embodiment, the semiconductor drive device 10 includes the overcurrent protection unit 12 including the overcurrent determination unit 13 which determines whether there is overcurrent flowing through the semiconductor switching element 50, and the gate voltage reducing unit 14 which reduces the gate voltage Vge when it is determined that there is the overcurrent. Then, the overcurrent determination unit 13 includes the clamp diode D1 for clamping the potential (input potential) VA1 of the part (connection point P1) where the detection signal SOC is inputted, at the gate potential, the first transistor Q1 to which the signal input part is connected, and the low-pass filter (R, C1) provided at the signal input part. When the input potential VA1 has reached the set value 2Vf, the first transistor Q1 is turned on, so that the overcurrent determination unit 13 determines that there is the overcurrent in the semiconductor switching element 50.

Thus, the overcurrent protection unit 12 can, without needing supply of power for itself, detect overcurrent of the semiconductor switching element 50 using threshold voltage of the first transistor Q1 and perform protection. In addition, overcurrent protection can be performed while preventing erroneous operation due to noise, owing to actions of the clamp diode D1 and the low-pass filter (R, C1).

Thus, even in a case where the semiconductor switching element 50 and the gate drive unit 11 of the semiconductor drive device 10 are located apart from each other, the overcurrent protection unit 12 which does not need supply of power is provided closely to the semiconductor switching element 50, whereby overcurrent protection can be performed with high reliability.

Actions of the clamp diode D1 and the low-pass filter (R, C1) will be described below.

In a case where the collector voltage Vce is used as the detection signal SOC as in the present embodiment, if a timing when the collector voltage Vce changes through switching goes beyond a design range or if the voltage amplitude of the collector voltage Vce goes beyond a design range, erroneous detection for overcurrent can occur.

For example, as the former case, it is assumed that reduction of the collector voltage Vce is delayed due to noise or the like at the time of ON operation of the semiconductor switching element 50. At this time, the gate voltage Vge increases so that the clamp diode D1 does not clamp the input potential VA1, and reduction of the collector voltage Vce that has occurred with delay, i.e., normal ON operation, is erroneously determined as overcurrent.

On the other hand, as the latter case, it is assumed that noise based on electric-field coupling or magnetic coupling is superimposed at the time of recovery or OFF operation of the semiconductor switching element 50. In a state in which the clamp diode D1 clamps the input potential VA1, due to voltage change or current change at the main terminal of the semiconductor switching element 50, noise not smaller than threshold voltage might be superimposed on the input potential VA1, i.e., the base of the first transistor Q1. In this case, recovery or normal OFF operation of the semiconductor switching element 50 is erroneously determined as overcurrent.

In the present embodiment, since the clamp diode D1 for clamping the input potential VA1 at the gate potential is provided, erroneous detection for overcurrent due to noise can be prevented when the semiconductor switching element 50 is OFF. In addition, since the clamp diode D1 and further the low-pass filter (R, C1) are provided, erroneous detection for overcurrent described above can also be prevented.

For example, the problem that erroneous detection occurs in ON operation of the semiconductor switching element 50 can be solved as follows. During a delay period from when the clamp diode D1 comes into a state of not clamping the input potential VA1 to when the collector voltage Vce is actually reduced, erroneous detection for overcurrent can be prevented by the low-pass filter (R, C1).

In addition, during an OFF state of the semiconductor switching element 50, when the gate potential is negatively biased, the capacitor C1 of the low-pass filter (R, C1) is also negatively biased via the clamp diode D1. Thus, both of a voltage margin and an electric charge margin until reaching erroneous detection for overcurrent can be expanded, whereby resistance to noise based on electric-field coupling or magnetic coupling can be improved at the time of recovery or OFF operation of the semiconductor switching element 50.

In the present embodiment, the reverse flow prevention diode D3 for preventing current from reversely flowing in the conduction direction of the first transistor Q1 is provided and the first transistor Q1 is protected, and also, a great negative bias (VG2+Vf) is applied to the capacitor C1 without being influenced by the protection diode D2. Thus, noise resistance of the first transistor Q1 is improved and erroneous detection for overcurrent can be prevented.

An NPN bipolar transistor is used as the first transistor Q1, and a signal based on the input potential VA1 to be used for determination is inputted to the base where a current amplification action is obtained. Thus, it is possible to effectively operate the first transistor Q1 with a small signal input.

Embodiment 2

In the above embodiment 1, the first transistor Q1 formed from an NPN bipolar transistor is used, whereas in the present embodiment 2, the first transistor Q1 is formed from a PNP bipolar transistor. Then, the second transistor Q2 is formed from an NPN bipolar transistor, and the third transistor Q3 is formed from a PNP bipolar transistor.

Figure 4:
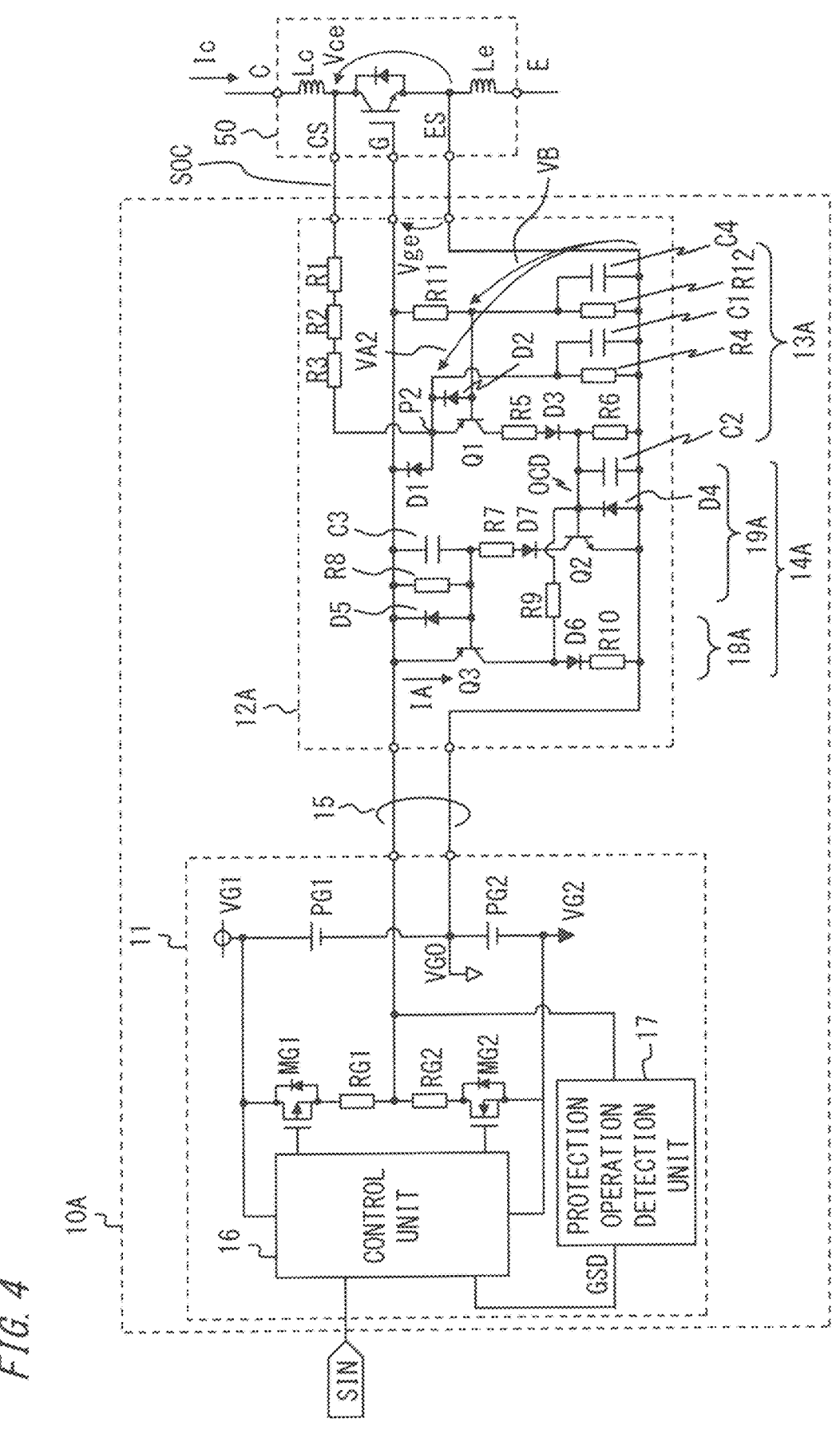
FIG. 4 shows the circuit configuration of a semiconductor drive device according to embodiment 2.

FIG. 4 shows the circuit configuration of a semiconductor drive device according to embodiment 2.

As shown in FIG. 4, a semiconductor drive device 10A includes the gate drive unit 11 and an overcurrent protection unit 12A. Some parts of the circuit configuration of the overcurrent protection unit 12A are different from the above embodiment 1, and the other parts are the same as in the above embodiment 1.

The overcurrent protection unit 12A uses the same detection signal SOC as in the above embodiment 1 and includes an overcurrent determination unit 13A which receives the detection signal SOC and outputs a determination signal OCD for overcurrent, and a gate voltage reducing unit 14A which reduces the gate voltage Vge on the basis of the determination signal OCD. The gate voltage reducing unit 14A includes a drive circuit 18A for reducing the gate voltage Vge and an amplification circuit 19A which amplifies an output signal from the overcurrent determination unit 13A, to drive the drive circuit 18A.

The overcurrent determination unit 13A includes the resistors R1, R2, R3, R4 connected in series, the clamp diode D1, and the capacitor C1. Further, the overcurrent determination unit 13A includes a series circuit in which the first transistor Q1 formed from a PNP bipolar transistor, the resistors R5, R6, and the reverse flow prevention diode D3 are connected in series. In addition, the capacitor C2 is connected in parallel to the resistor R6, and the protection diode D2 is connected between the base and the emitter of the first transistor Q1. Further, the overcurrent determination unit 13A includes resistors R11, R12 connected in series and a capacitor C4 connected in parallel to the resistor R12.

Also in this case, the resistor R including three resistors R1, R2, R3 and the capacitor C1 form the low-pass filter (R, C1).

A connection point P2 between the resistor R (R1, R2, R3) and the resistor R4 is an input part for the detection signal SOC and is connected to the emitter of the first transistor Q1. The potential at the connection point P2 which is an emitter potential of the first transistor Q1, based on the emitter control terminal ES as a reference, is an input potential VA2.

The emitter potential (input potential VA2) of the first transistor Q1 is represented by the following expression.

$$VA2 = Vce \times R4/(R1 + R2 + R3 + R4)$$

A base potential VB of the first transistor Q1 is a potential at a connection point between the resistor R11 and the resistor R12, and is represented by the following expression.

$$VB = Vge \times R12/(R11 + R12)$$

Also in the present embodiment, overcurrent is detected through the first transistor Q1 being turned on. When the first transistor Q1 is turned on, the emitter potential (input potential VA2) is represented by the following Expression (3).

$$VA2 = VB + Vf \qquad \text{Expression (3)}$$

When the semiconductor switching element 50 is turned off, the emitter potential (input potential VA2) of the first transistor Q1 is negatively biased immediately due to an action of the clamp diode D1. Thus, erroneous detection for overcurrent in OFF operation of the semiconductor switching element 50 can be prevented. In addition, the initial state of the capacitor C1 in the low-pass filter (R, C1) is negatively biased, whereby, also in ON operation of the semiconductor switching element 50, erroneous detection for overcurrent can be prevented.

Next, the amplification circuit 19A in the gate voltage reducing unit 14A is a circuit for amplifying the determination signal OCD from the overcurrent determination unit 13A, and includes a series circuit in which the second transistor Q2 formed from an NPN bipolar transistor, the resistors R7, R8, and a reverse flow prevention diode D7 are connected in series. In addition, the capacitor C3 is connected in parallel to the resistor R8, and the protection diode D4 is provided between the base and the emitter of the second transistor Q2. Voltage of the determination signal OCD is applied to the base of the second transistor Q2.

The drive circuit 18A in the gate voltage reducing unit 14A is a circuit for amplifying an output signal from the overcurrent determination unit 13A, and includes a series circuit in which the third transistor Q3 formed from a PNP bipolar transistor, the resistor R10, and the diode D6 are connected in series. In addition, the resistor R9 is provided between the series circuit and the base of the second transistor Q2, and the protection diode D5 is provided between the base and the emitter of the third transistor Q3.

Also in the present embodiment, as in the above embodiment 1, when the first transistor Q1 is turned on and thus the semiconductor switching element 50 is determined to be in an overcurrent state, the second transistor Q2 is turned on and further the third transistor Q3 is turned on.

Also in this case, the resistors R5, R6 connected in series to the first transistor Q1 are set appropriately so that the second transistor Q2 is turned on after the first transistor Q1 is turned on. In addition, the resistors R7, R8 connected in series to the second transistor Q2 are set appropriately so that the third transistor Q3 is turned on after the second transistor Q2 is turned on.

Then, the gate discharge current IA for discharging electric charge in the capacitance (gate electric charge) between the gate and the emitter of the semiconductor switching element 50 flows through the third transistor Q3, to reduce the gate voltage Vge. Thus, overcurrent of the semiconductor switching element 50 can be suppressed.

Figure 5:
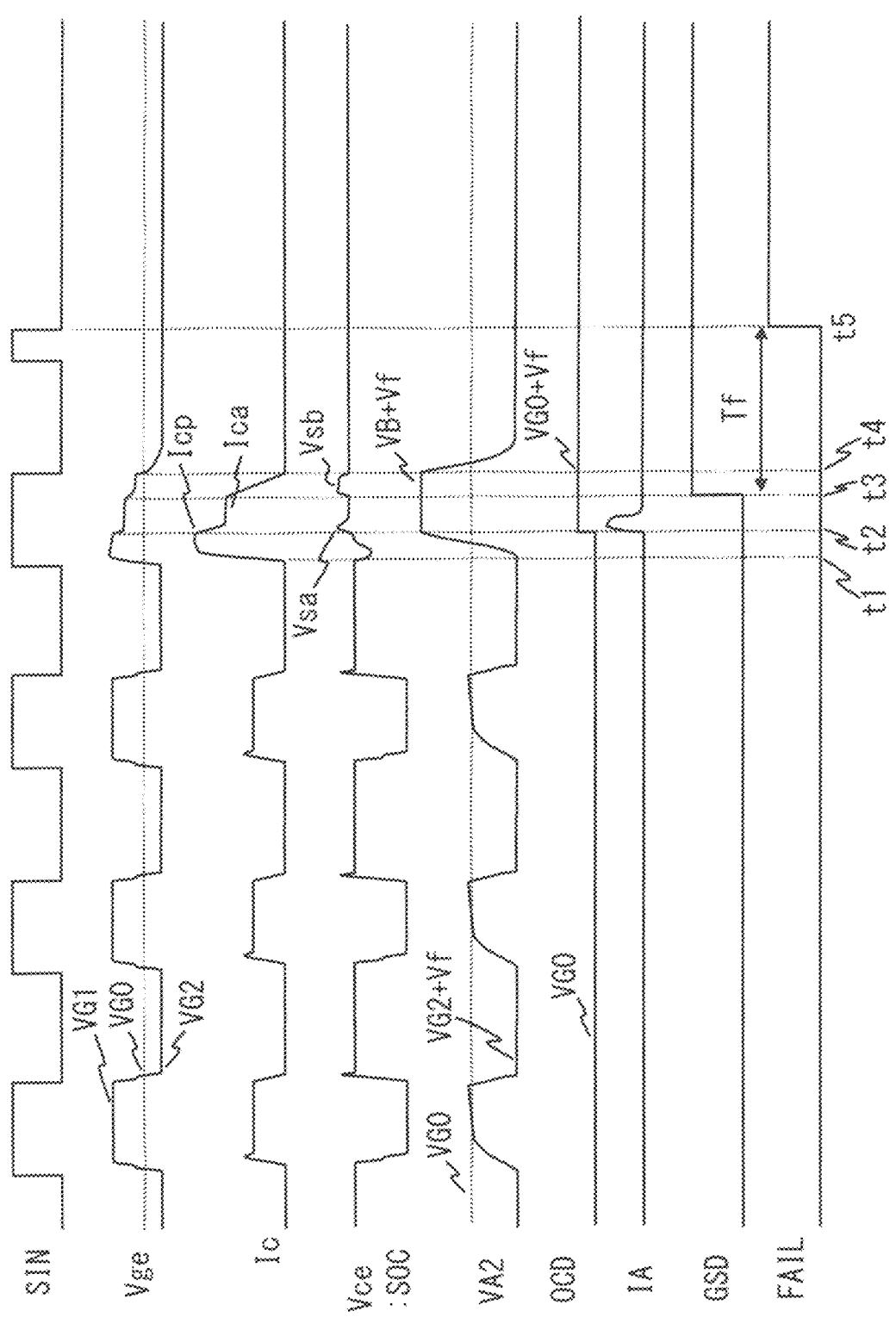
FIG. 5 is a waveform diagram at each part showing operation of the semiconductor drive device according to embodiment 2.

FIG. 5 is a waveform diagram at each part showing operation of the semiconductor drive device according to embodiment 2.

Hereinafter, with reference to FIG. 4 and FIG. 5, overcurrent protection operation by the semiconductor drive device 10A will be described. Description of the same parts as in the above embodiment 1 will be omitted as appropriate, and the emitter potential (input potential) VA2 of the first transistor Q1 and the determination signal OCD will be mainly described.

In a normal state before time t1, when the semiconductor switching element 50 is OFF, the emitter potential (input potential) VA2 of the first transistor Q1 based on the emitter control terminal ES as a reference is clamped at a potential (VG2+Vf) obtained by adding the forward-direction voltage Vf of the clamp diode D1 to the negative power supply potential VG2. When the semiconductor switching element 50 is ON, the collector voltage Vce is reduced to several V and the voltage VA2 divided by the resistor R (R1, R2, R3) and the resistor R4 becomes a value close to the reference potential VG0.

The potential of the determination signal OCD, i.e., the base potential of the second transistor Q2, is kept at the reference potential VG0 irrespective of the ON/OFF state of the semiconductor switching element 50.

At time t1, after the semiconductor switching element 50 is turned on, when overcurrent occurs due to arm short-circuit with another connected arm, or the like, a peak value Icp of the collector current Ic is saturated and the collector voltage Vce which would be normally reduced becomes high. Thus, the emitter potential (input potential) VA2 of the first transistor Q1 increases beyond the reference potential VG0.

At time t2, the emitter potential (input potential) VA2 of the first transistor Q1 becomes (VB+Vf) through increase, i.e., the above Expression (3) is satisfied, so that the first transistor Q1 is turned on. Thus, overcurrent of the semiconductor switching element 50 is detected. When the first transistor Q1 is turned on, the potential of the determination signal OCD is increased, and then, when the potential reaches a potential (VG0+Vf) that is higher than the reference potential VG0 by the threshold voltage Vf of the second transistor Q2, the second transistor Q2 is turned on. Thus, the base potential of the third transistor Q3 decreases and voltage not smaller than the threshold voltage Vf is applied to the base, so that the third transistor Q3 is turned on.

Then, the gate discharge current IA flows and the gate voltage Vge is reduced. At this time, the collector current Ic is reduced to a value Ica corresponding to the reduced gate voltage Vge, and along with this, the surge voltage Vsa occurs in the collector voltage Vce.

At time t3, the protection operation detection unit 17 detects reduction in the gate voltage Vge and generates the signal GSD.

During a period from time t3 to time t4, the control unit 16 performs current interruption operation to the semiconductor switching element 50 so as to be turned off.

At time t5, the command signal SIN from the host control device is kept in an OFF state and an abnormal signal FAIL is generated.

Also in the present embodiment, as in the above embodiment 1, the overcurrent protection unit 12A can, without needing supply of power for itself, detect overcurrent of the semiconductor switching element 50 using threshold voltage of the first transistor Q1 and perform protection. In addition, overcurrent protection can be performed while preventing erroneous operation due to noise, owing to actions of the clamp diode D1 and the low-pass filter (R, C1).

Thus, even in a case where the semiconductor switching element 50 and the gate drive unit 11 of the semiconductor drive device 10A are located apart from each other, the overcurrent protection unit 12 which does not need supply of power is provided closely to the semiconductor switching element 50, whereby overcurrent protection can be performed with high reliability.

Further, the reverse flow prevention diode D3 is provided and the first transistor Q1 is protected, and also, noise resistance of the first transistor Q1 is improved and erroneous detection for overcurrent can be prevented.

In the present embodiment, since a PNP bipolar transistor is used as the first transistor Q1 in the overcurrent determination unit 13A, the input potential VA2 to be used for determination can be increased to a higher level, and thus voltage noise resistance can be improved.

Embodiment 3

In the above embodiments 1 and 2, overcurrent is determined on the basis of the input potential VA1, VA2 obtained by reducing the collector voltage Vce (detection signal SOC) of the semiconductor switching element 50 by voltage-division resistors, whereas in the present embodiment, a different method is used.

Figure 6:
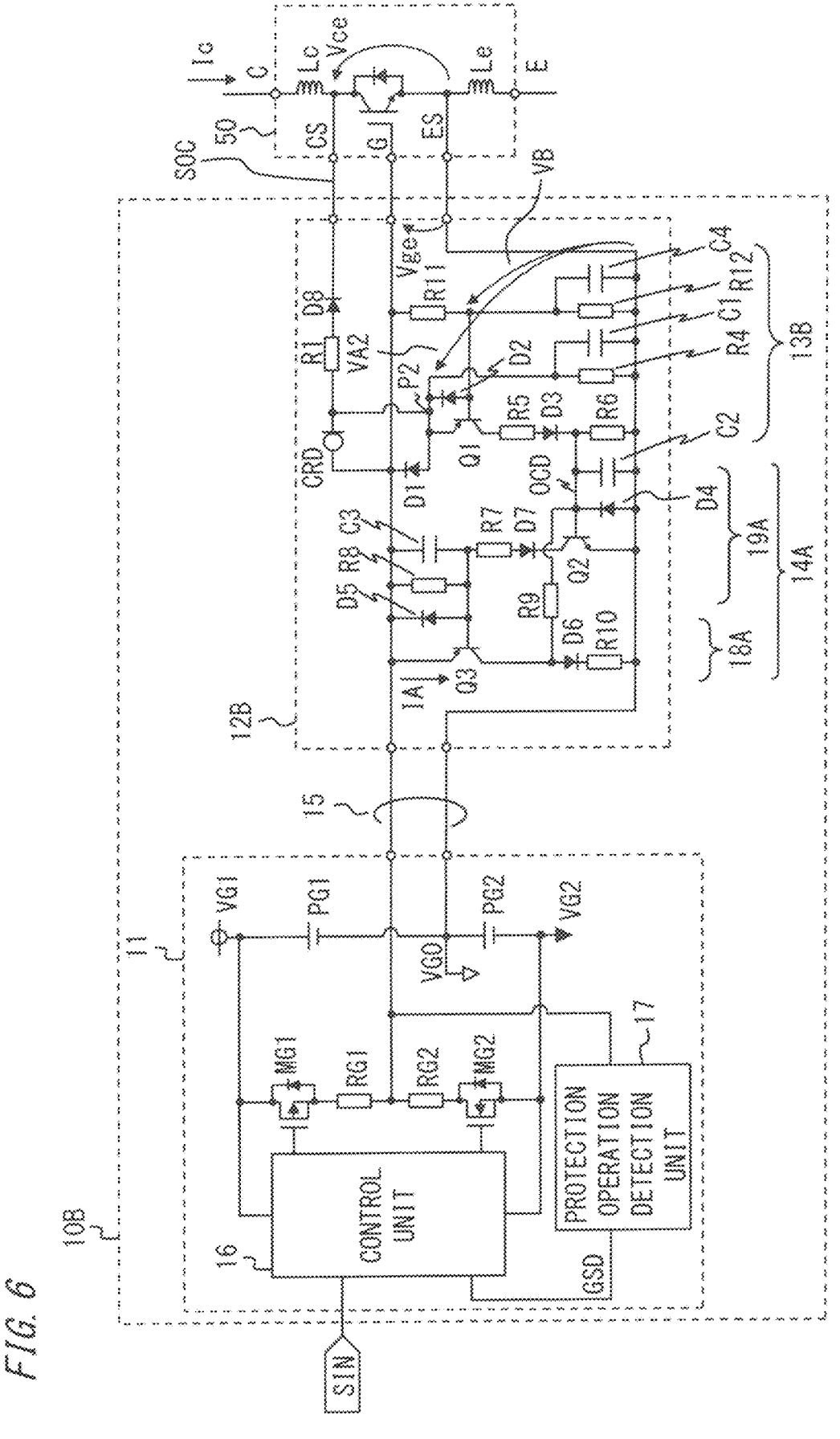
FIG. 6 shows the circuit configuration of a semiconductor drive device according to embodiment 3.

FIG. 6 shows the circuit configuration of a semiconductor drive device according to embodiment 3.

As shown in FIG. 6, a semiconductor drive device 10B includes the gate drive unit 11 and an overcurrent protection unit 12B. The overcurrent protection unit 12B includes an overcurrent determination unit 13B which outputs a determination signal OCD for overcurrent on the basis of the same detection signal SOC as in the above embodiments 1 and 2, and the gate voltage reducing unit 14A which reduces the gate voltage Vge on the basis of the determination signal OCD.

The configuration in the present embodiment is the same as that in the above embodiment 2 except that the detection signal SOC is connected to the overcurrent determination unit 13B. In this case, a DESAT method is used in which constant current is applied to the collector sense terminal CS side of the semiconductor switching element 50 via a high-withstand-voltage diode D8 and determination for the collector voltage Vce (detection signal SOC) is performed. Hereinafter, difference from the above embodiment 2 will be described.

The overcurrent determination unit 13B is configured such that a constant-current diode CRD, the resistor R1, and the high-withstand-voltage diode D8 are connected in series to the collector sense terminal CS. The constant-current diode CRD is connected to a power supply line connected to the gate terminal G, and a connection point between the constant-current diode CRD and the resistor R1 is connected to the emitter of the first transistor Q1.

In this case, the resistor R of the low-pass filter (R, C1) is formed of only the resistor R1.

The connection point P2 connected to the emitter of the first transistor Q1 from the constant-current diode CRD is an input part for the detection signal SOC, and the potential at the connection point P2 which is an emitter potential of the first transistor Q1 is an input potential VA2.

When the semiconductor switching element 50 is ON, the constant-current diode CRD acts so as to allow constant current at about several mA to flow from the positive power supply potential VG1. In a normal state in which current is not saturated in the semiconductor switching element 50, since the collector voltage Vce is reduced to several V, current of the constant-current diode CRD flows to the collector sense terminal CS. At this time, the emitter potential (input potential VA2) of the first transistor Q1 is reduced to several V, and therefore the first transistor Q1 is not turned on.

When current is saturated in the semiconductor switching element 50 and the collector voltage Vce increases, current from the constant-current diode CRD cannot flow to the collector sense terminal CS but flows to the resistor R4. Thus, the emitter potential (input potential) VA2 of the first transistor Q1 increases to (VB+Vf), i.e., the above Expression (3) is satisfied, so that the first transistor Q1 is turned on. Thus, overcurrent of the semiconductor switching element 50 is detected.

Here, a product of the constant current value of the constant-current diode CRD and the resistance value of the resistor R4 is set in advance so as to be greater than VB+Vf.

When the first transistor Q1 is turned on, the second transistor Q2 is turned on and further the third transistor Q3 is turned on. Then, the gate discharge current IA flows, so that the gate voltage Vge is reduced.

Operation waveforms at parts in the present embodiment 3 are the same as those shown in FIG. 5 in the above embodiment 2, and the same effects as described in the above embodiment 2 are obtained.

In addition, in the present embodiment, the collector voltage Vce can be detected over a range to a lower level as compared to the above embodiments 1 and 2 in which the collector voltage Vce reduced by the voltage-division resistors is detected.

Embodiment 4

In the above embodiments 1 to 3, the collector voltage Vce of the semiconductor switching element 50 is detected from the collector sense terminal CS and used as the detection signal SOC, whereas in the present embodiment, a different detection signal SOC is used.

Figure 7:
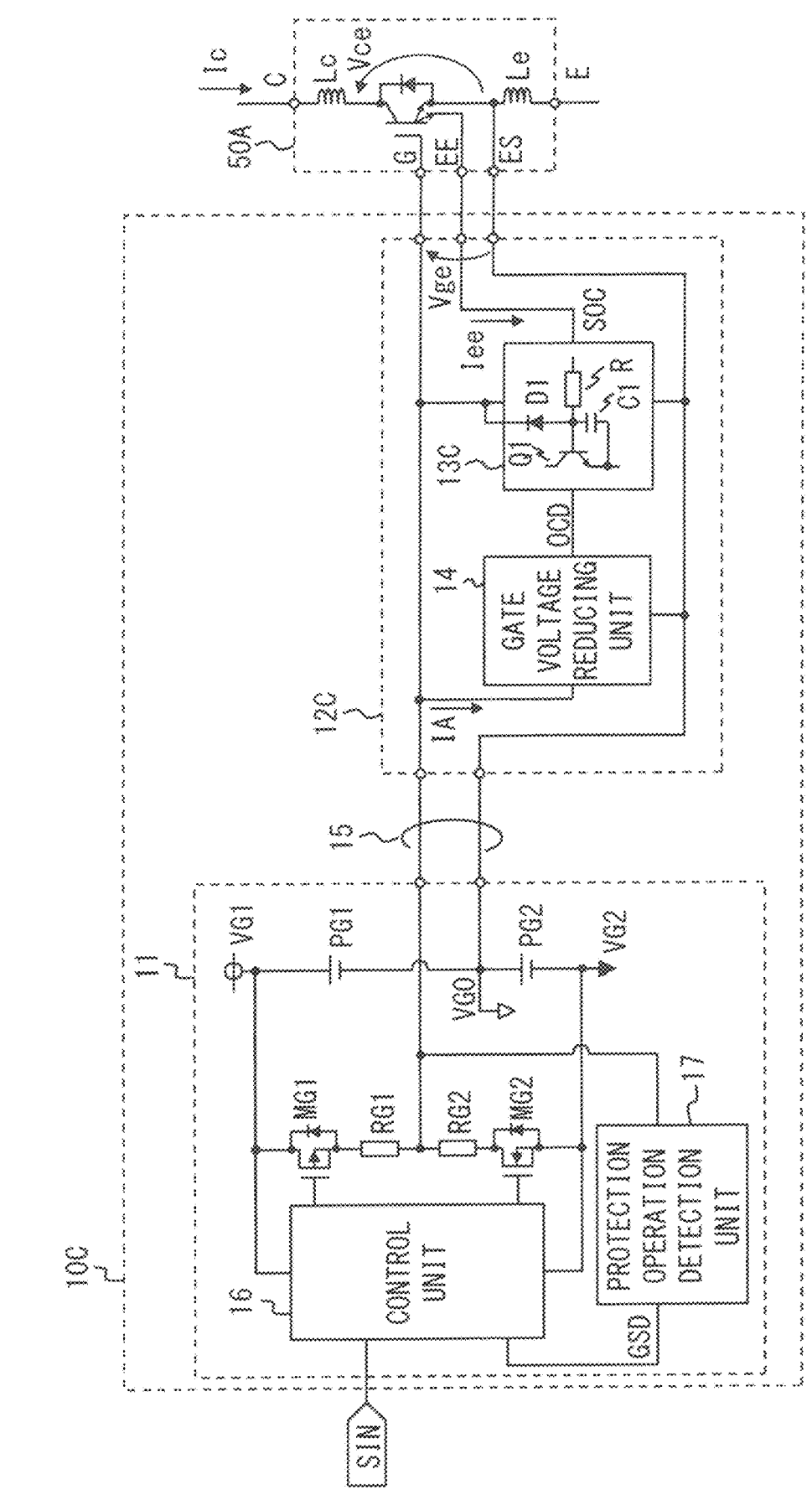
FIG. 7 shows the schematic configuration of a semiconductor drive device according to embodiment 4.

FIG. 7 shows the schematic configuration according to embodiment 4.

In the present embodiment 4, a semiconductor switching element 50A has, on the emitter side, a current detection element through which current reduced to one several thousandth, for example, flows, and the reduced emitter current Icc flowing from a current detection terminal EE thereof is used as the detection signal SOC.

As shown in FIG. 7, a semiconductor drive device 10C includes the gate drive unit 11 and an overcurrent protection unit 12B. The overcurrent protection unit 12C includes an overcurrent determination unit 13C which outputs the determination signal OCD for overcurrent on the basis of the emitter current Iee (detection signal SOC), and the gate voltage reducing unit 14 which reduces the gate voltage Vge on the basis of the determination signal OCD. The gate drive unit 11 and the gate voltage reducing unit 14 are the same as those in the above embodiment 1.

The overcurrent determination unit 13C also has the same circuit configuration as the overcurrent determination unit 13 in the above embodiment 1, although the used detection signal SOC is different.

Figure 8:
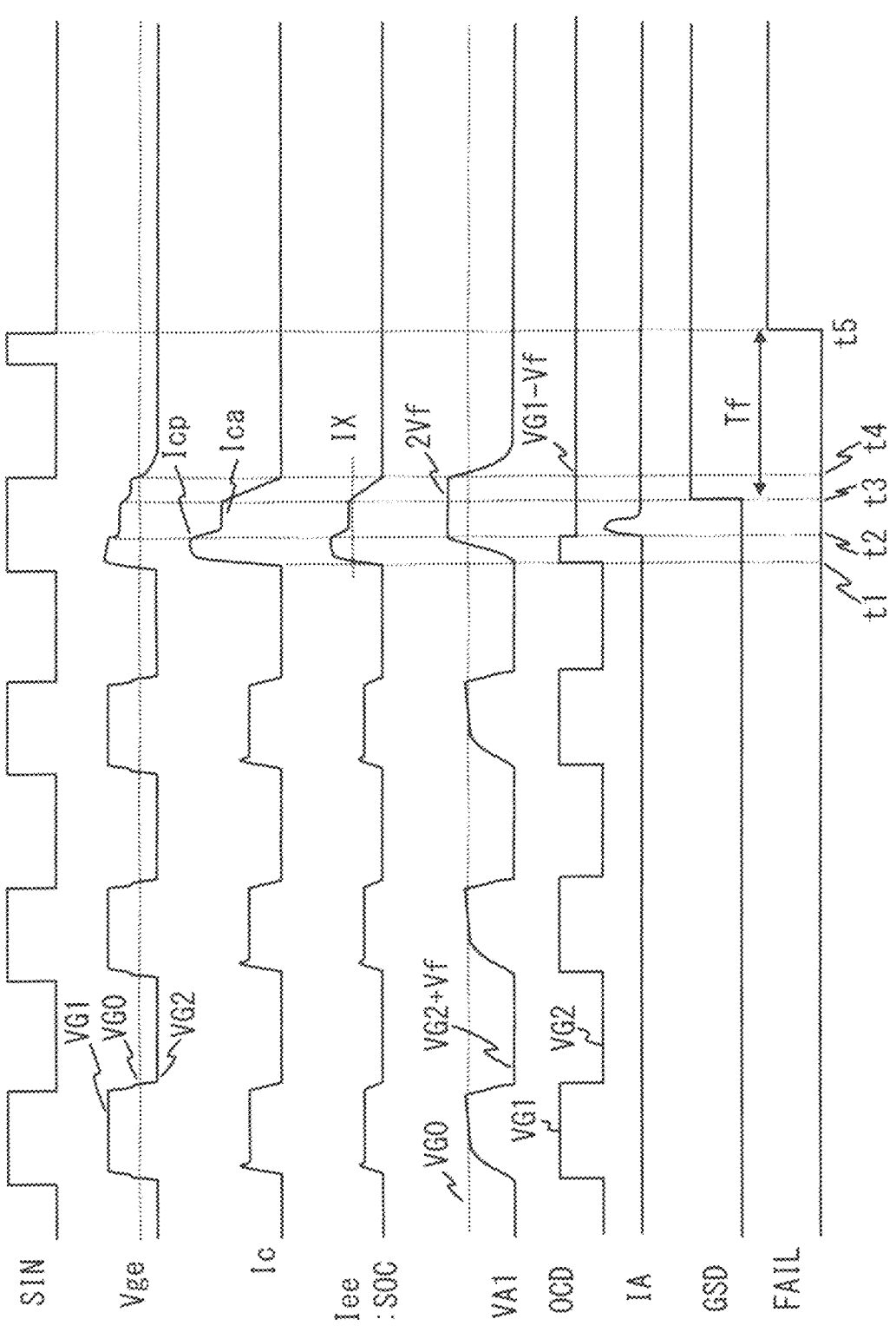
FIG. 8 is a waveform diagram at each part showing operation of the semiconductor drive device according to embodiment 4.

FIG. 8 is a waveform diagram at each part showing operation of the semiconductor drive device according to embodiment 4.

In this case, the emitter current Iee as the detection signal SOC is connected to the base of the first transistor Q1, to become base current inputted to the base.

In an ON state of the semiconductor switching element 50A, when overcurrent has occurred, the emitter current Iee (detection signal SOC) increases, and when the emitter current Iee exceeds a set threshold IX, the first transistor Q1 is turned on. Thus, overcurrent of the semiconductor switching element 50 is detected. Except that the emitter current Iee is used as the detection signal SOC, operation waveforms at parts are the same as those shown in FIG. 3 in the above embodiment 1.

Also in the present embodiment, the same effects as in the above embodiment 1 are obtained. Although the above configuration can be applied to only the case of using the semiconductor switching element 50A having the current detection element, overcurrent determination is performed by detecting the current value itself without needing contact with a high-voltage part, and therefore it is possible to detect overcurrent with high accuracy.

Embodiment 5

In the present embodiment, a still different detection signal SOC is used.

Figure 9:
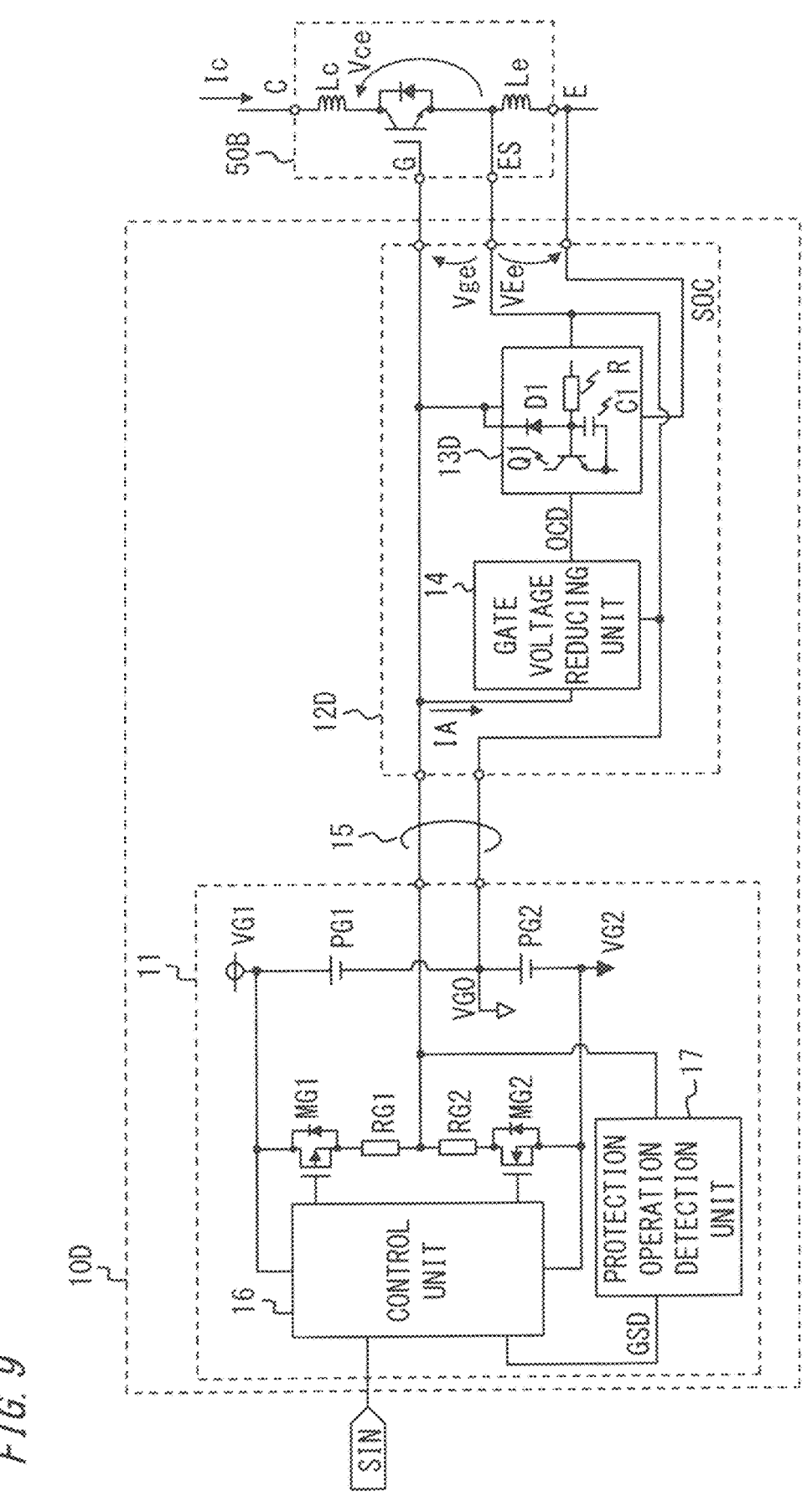
FIG. 9 shows the schematic configuration of a semiconductor drive device according to embodiment 5.

FIG. 9 shows the schematic configuration of a semiconductor drive device according to embodiment 5.

In the present embodiment 5, emitter voltage VEe between the emitter control terminal ES and the emitter E which is the low-voltage-side main terminal of the semiconductor switching element 50B is used as the detection signal SOC. In this case, electromotive voltage (Le·dIc/dt) generated at the parasitic inductance Le on the emitter side is used.

As shown in FIG. 9, a semiconductor drive device 10D includes the gate drive unit 11 and an overcurrent protection unit 12D. The overcurrent protection unit 12D includes an overcurrent determination unit 13D which outputs the determination signal OCD for overcurrent on the basis of the emitter voltage VEe (detection signal SOC), and the gate voltage reducing unit 14 which reduces the gate voltage Vge on the basis of the determination signal OCD. The gate drive unit 11 and the gate voltage reducing unit 14 are the same as those in the above embodiment 1.

The overcurrent determination unit 13D also has the same circuit configuration as the overcurrent determination unit 13 in the above embodiment 1, although the used detection signal SOC is different.

In the above embodiment 1, the entire overcurrent protection unit 12 is configured using the potential of the emitter control terminal ES as a reference, whereas in the present embodiment, only the overcurrent determination unit 13D in the overcurrent protection unit 12D is configured using the potential of the emitter E as a reference, and the other parts are configured using the potential of the emitter control terminal ES as a reference. That is, the emitter control terminal ES is connected to the high-voltage side of the resistor R1, and the emitter voltage VEe (detection signal SOC) from the emitter E is connected to the low-voltage-side of the resistor R4.

Figure 10:
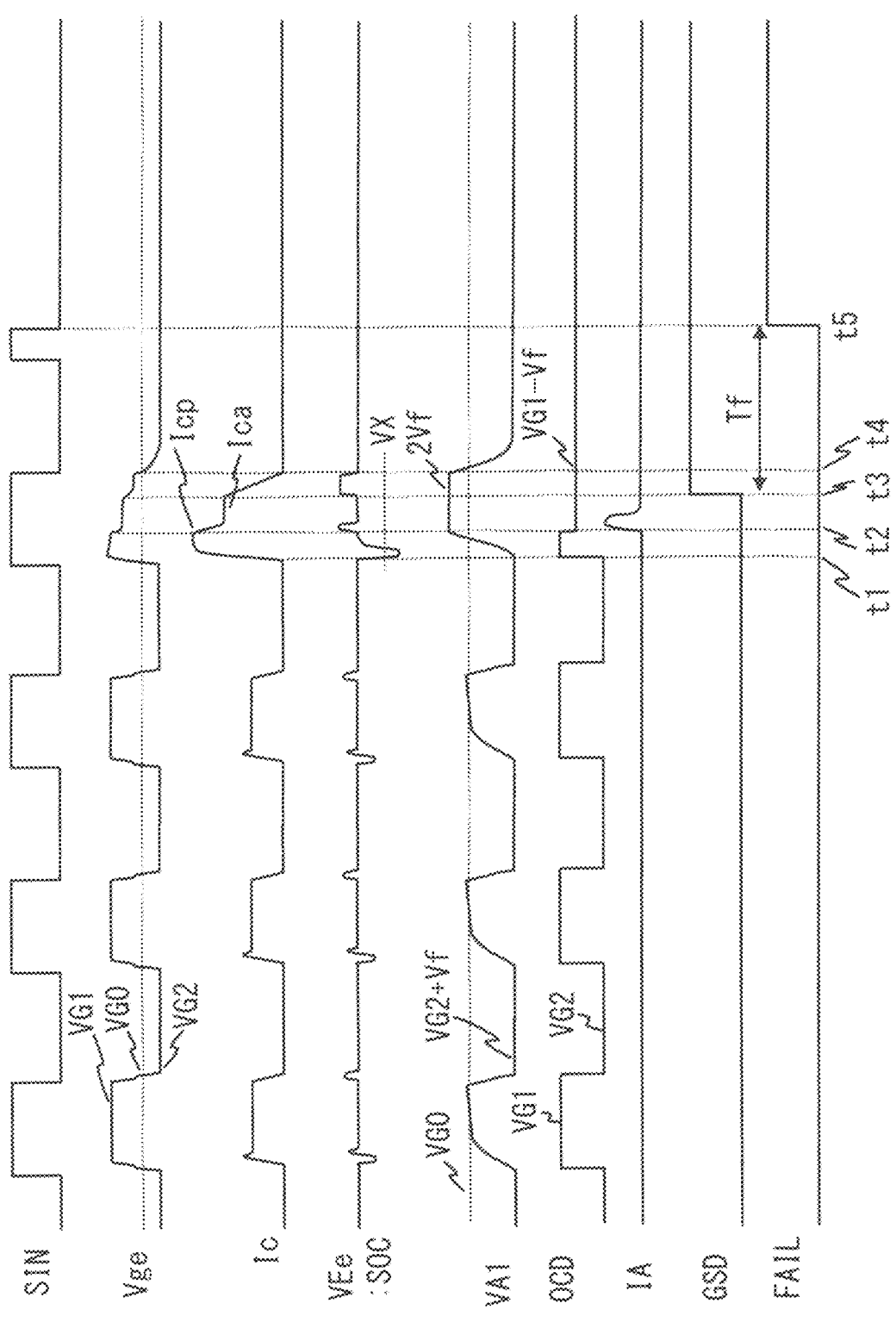
FIG. 10 is a waveform diagram at each part showing operation of the semiconductor drive device according to embodiment 5.

FIG. 10 is a waveform diagram at each part showing operation of the semiconductor drive device according to embodiment 5.

In this case, the emitter voltage VEe as the detection signal SOC has a waveform similar to a differential value (dIc/dt) of the collector current Ic.

In an ON state of the semiconductor switching element 50B, when overcurrent has occurred, the emitter voltage VEe (detection signal SOC) is reduced, and when the emitter voltage VEe is reduced below a set threshold VX, the first transistor Q1 is turned on. Thus, overcurrent of the semiconductor switching element 50B is detected. Except that the emitter voltage VEe is used as the detection signal SOC, operation waveforms at parts are the same as those shown in FIG. 3 in the above embodiment 1.

Also in the present embodiment, the same effects as in the above embodiment 1 are obtained. In addition, it is possible to detect overcurrent by acquiring current information at high speed and with high accuracy without having a current detection element, using electromotive voltage generated at the parasitic inductance Le on the emitter side.

In the above embodiment, the emitter voltage VEe is compared with the threshold VX which is determination voltage. However, a voltage amplitude (Le·dIc/dt) of the emitter voltage VEe may be integrated by an integration circuit to acquire information similar to the collector current Ic, whereby overcurrent determination may be performed.

Embodiment 6

In the present embodiment, a signal obtained by detecting the change rate of current between the main terminals and converting the change rate to voltage is used as the detection signal SOC.

Figure 11:
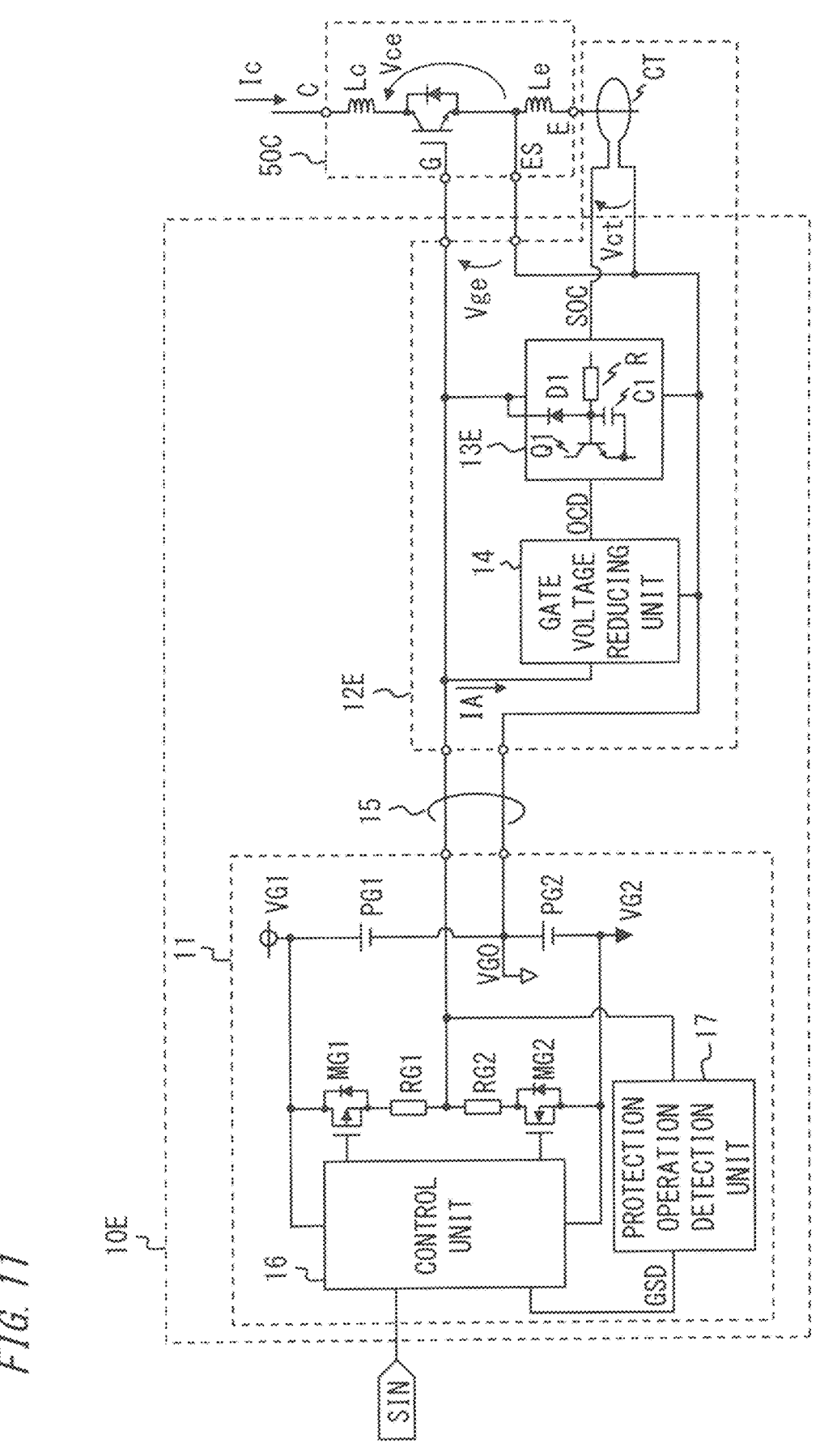
FIG. 11 shows the schematic configuration of a semiconductor drive device according to embodiment 6.

FIG. 11 shows the schematic configuration of a semiconductor drive device according to embodiment 6.

As shown in FIG. 11, a current-voltage conversion element CT is provided on the outer side of the emitter E which is one main terminal of the semiconductor switching element 50C. The current-voltage conversion element CT detects the change rate of the collector current Ic which is current between the main terminals, and outputs voltage information Vct (detection signal SOC).

As the current-voltage conversion element CT, for example, a Rogowski coil formed on a printed board forming the overcurrent protection unit 12E may be used.

As shown in FIG. 11, a semiconductor drive device 10E includes the gate drive unit 11 and an overcurrent protection unit 12E. The overcurrent protection unit 12E includes an overcurrent determination unit 13E which outputs the determination signal OCD for overcurrent on the basis of the voltage information Vct (detection signal SOC), and the gate voltage reducing unit 14 which reduces the gate voltage Vge on the basis of the determination signal OCD.

The gate drive unit 11 and the gate voltage reducing unit 14 are the same as those in the above embodiment 1.

The overcurrent determination unit 13E also has the same circuit configuration as the overcurrent determination unit 13 in the above embodiment 1, although the used detection signal SOC is different.

Figure 12:
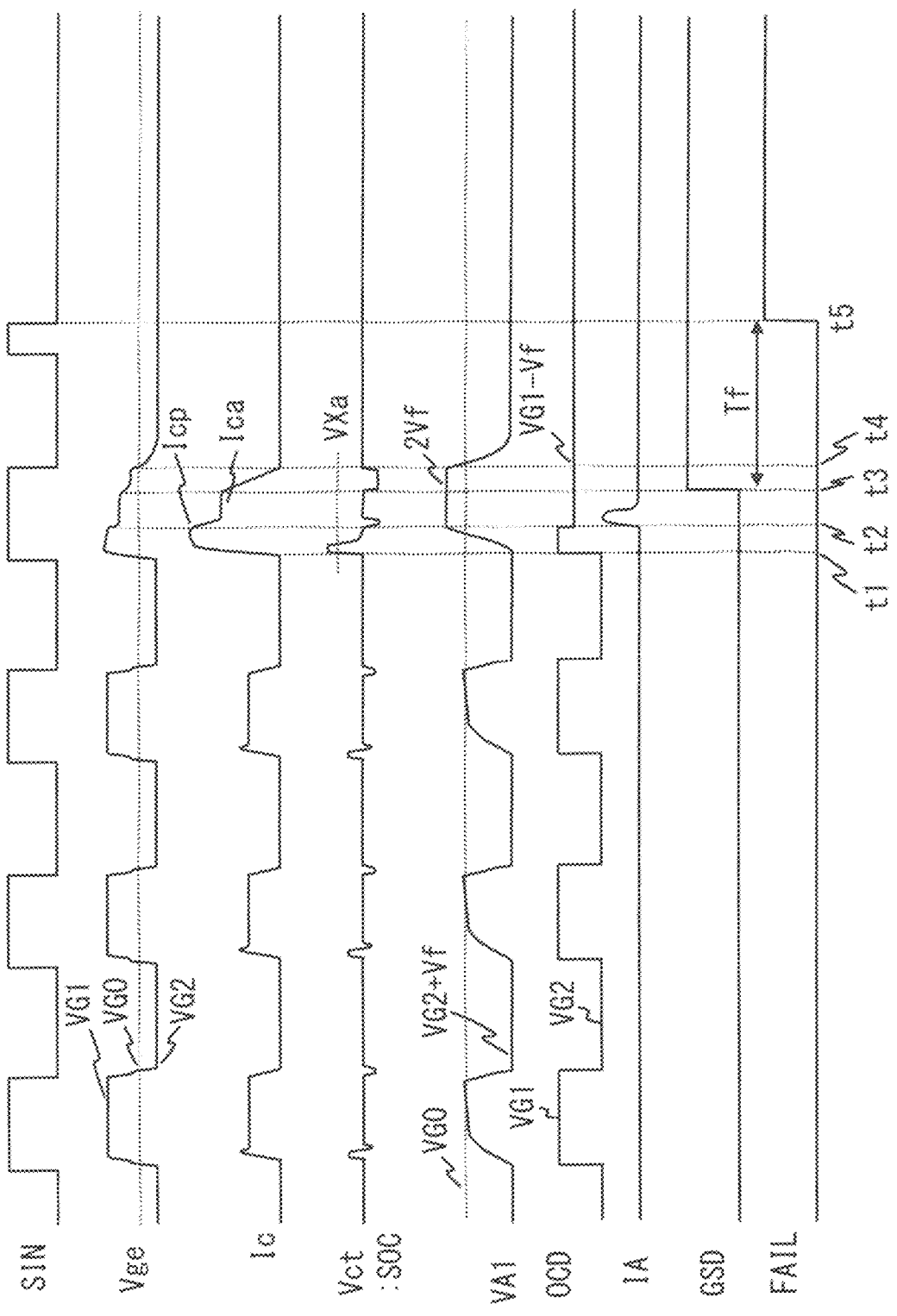
FIG. 12 is a waveform diagram at each part showing operation of the semiconductor drive device according to embodiment 6.

FIG. 12 is a waveform diagram at each part showing operation of the semiconductor drive device according to embodiment 6.

In this case, the voltage information Vct as the detection signal SOC has a waveform similar to a differential value (dIc/dt) of the collector current Ic.

In an ON state of the semiconductor switching element 50C, when overcurrent has occurred, the voltage information Vct (detection signal SOC) increases, and when the voltage information Vct exceeds a set threshold VXa, the first transistor Q1 is turned on. Thus, overcurrent of the semiconductor switching element 50C is detected. Except that the voltage information Vct is used as the detection signal SOC, operation waveforms at parts are the same as those shown in FIG. 3 in the above embodiment 1.

Also in the present embodiment, the same effects as in the above embodiment 1 are obtained.

In addition, if the overcurrent protection unit 12E is provided on a printed board and a Rogowski coil (current-voltage conversion element CT) formed on the printed board is used, overcurrent detection can be performed in a contactless manner and with high accuracy.

Embodiment 7

In the above embodiment 1, the low-pass filter (R, C1) is provided at the input part for the detection signal SOC. In the present embodiment, a semiconductor drive device having a first low-pass filter and a second low-pass filter as the low-pass filter will be described.

Figure 13:
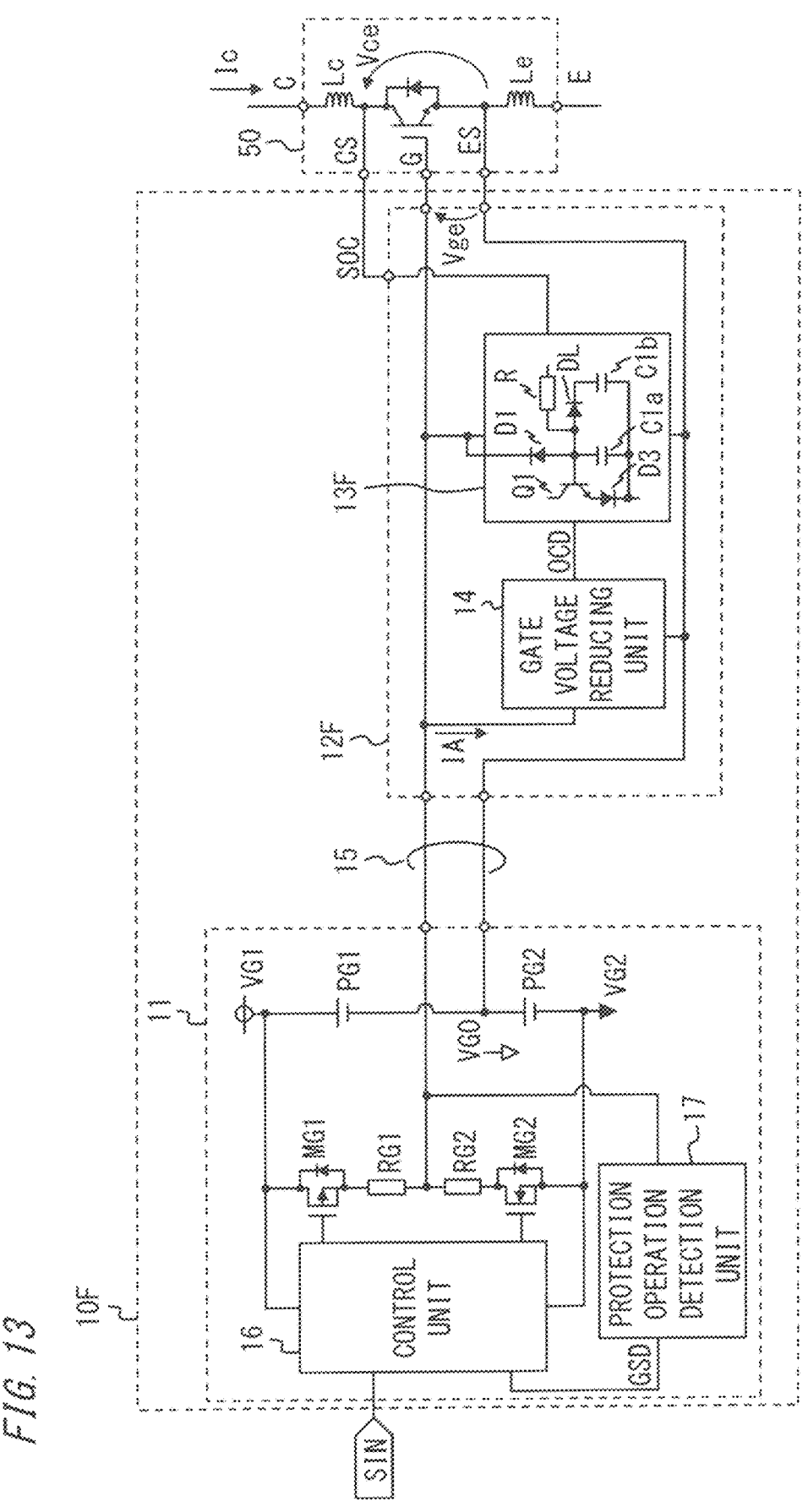
FIG. 13 shows the schematic configuration of a semiconductor drive device according to embodiment 7.

FIG. 13 shows the schematic configuration of a semiconductor drive device according to embodiment 7.

As shown in FIG. 13, a semiconductor drive device 10F includes the gate drive unit 11 and an overcurrent protection unit 12F. The overcurrent protection unit 12F includes an overcurrent determination unit 13F which determines whether there is overcurrent flowing through the semiconductor switching element 50, and the gate voltage reducing unit 14 which reduces voltage applied to the gate terminal G of the semiconductor switching element 50, when it is determined that there is overcurrent. The gate drive unit 11 and the gate voltage reducing unit 14 are the same as those in the above embodiment 1.

The overcurrent determination unit 13F includes the first transistor Q1, the clamp diode D1, the reverse flow prevention diode D3, the resistor R, capacitors C1a, C1b, and a diode DL. In this case, a first low-pass filter (R, C1a) is formed by the resistor R and the capacitor C1a, and a second low-pass filter (R, C1b) is formed by the resistor R and the capacitor C1b.

The detection signal SOC based on the collector voltage Vce which is voltage between the main terminals of the semiconductor switching element 50 is inputted to the first transistor Q1 via the first low-pass filter (R, C1a) and the second low-pass filter (R, C1b), and the determination signal OCD for overcurrent is outputted.

Figure 14:
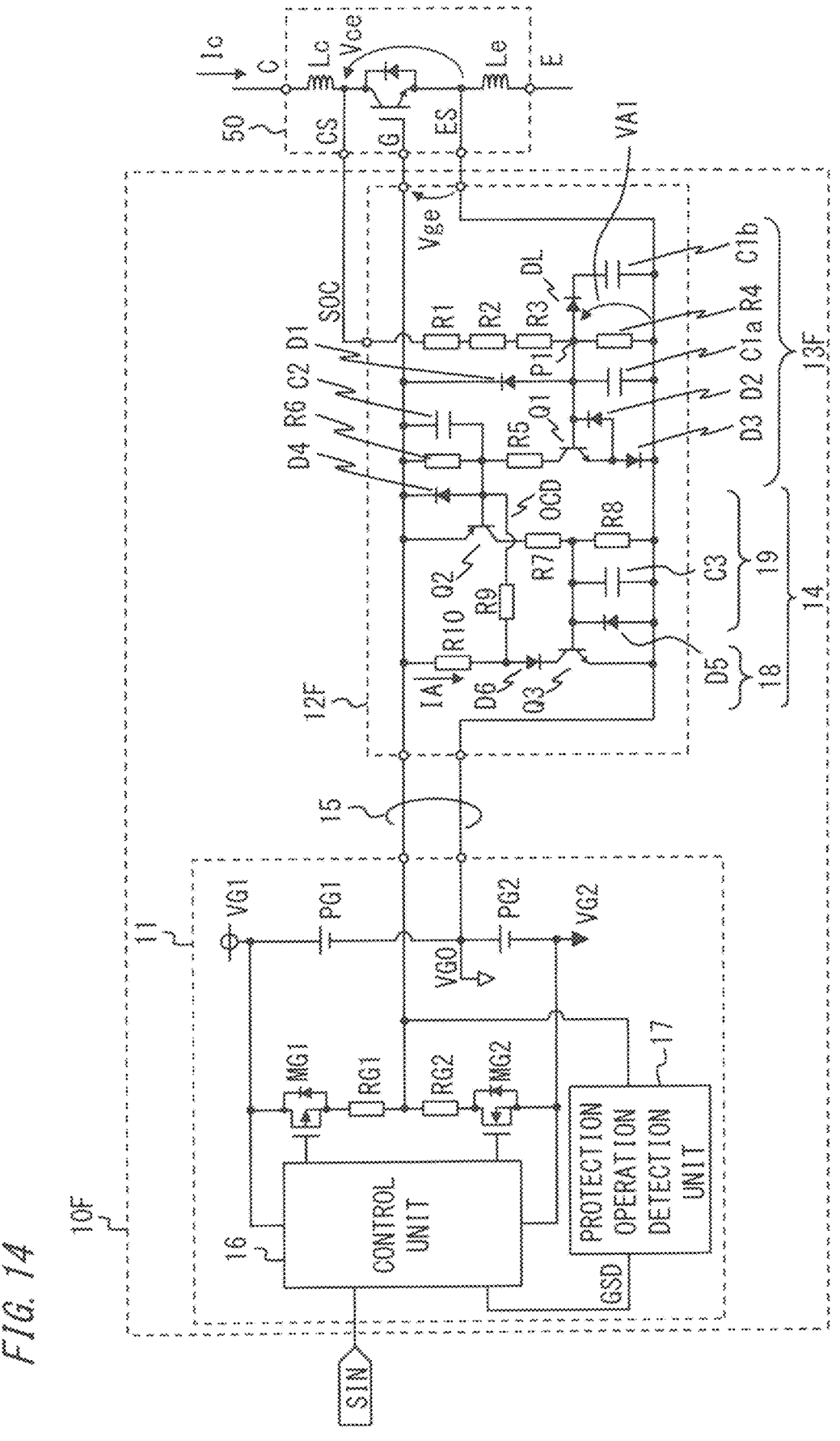
FIG. 14 shows the circuit configuration of the semiconductor drive device according to embodiment 7.

FIG. 14 shows the circuit configuration of the semiconductor drive device according to embodiment 7.

As shown in FIG. 14, in the overcurrent determination unit 13F, the resistor R including three resistors R1, R2, R3 and the capacitors C1a, C1b form the first low-pass filter (R, C1a) and the second low-pass filter (R, C1b). The connection point P1 between the resistor R (R1, R2, R3) and the resistor R4 is an input part for the detection signal SOC and is connected to the base of the first transistor Q1. The potential at the connection point P1 which is a base potential of the first transistor Q1, based on the emitter control terminal ES as a reference, is an input potential VA1.

The anode of the clamp diode D1 for clamping at the gate potential (Vge) is connected to the capacitor C1 of the first low-pass filter (R, C1a). A connection point therebetween is connected to the connection point P1 and the base of the first transistor Q1, and is connected to the capacitor C1b of the second low-pass filter (R, C1b) via the diode DL.

The detection signal SOC undergoes voltage division by the resistors R1 to R4 and then is inputted to the base of the first transistor Q1 via the first low-pass filter (R, C1a) and the second low-pass filter (R, C1b) formed by the voltage-division resistor R (R1, R2, R3) and the two capacitors C1a, C1b.

The base of the first transistor Q1 is clamped at the negative power supply potential VG2 by the clamp diode D1 when the semiconductor switching element 50 is OFF. The first low-pass filter (R, C1a) is clamped at the gate potential (Vge) via the clamp diode D1. Meanwhile, the second low-pass filter (R, C1b) is not clamped at the gate potential (Vge) by an action of the diode DL.

The diode DL is provided for preventing the second low-pass filter (R, C1b) from being clamped at the negative power supply potential VG2, and the forward-direction voltage thereof becomes offset voltage of the second low-pass filter (R, C1b). The offset voltage leads to reduction in noise resistance of the first transistor Q1.

Therefore, a diode having small forward-direction voltage, e.g., a Schottky barrier diode, is used to reduce the offset voltage. In addition, as shown in FIG. 14, the reverse flow prevention diode D3 is provided on the emitter side of the first transistor Q1, whereby the offset voltage can be removed.

The capacitor C1a of the first low-pass filter (R, C1a) is formed to have a small capacitance, and the capacitor C1b of the second low-pass filter (R, C1b) is formed to have a large capacitance.

When the semiconductor switching element 50 is OFF, the capacitor C1a of the first low-pass filter (R, C1a) is negatively biased. Then, when the semiconductor switching element 50 is turned on and the capacitor C1a returns from the negative bias state, the returning takes a time if the capacitance of the capacitor C1a is large. Here, since the capacitance of the capacitor C1a is small, the capacitor C1a can return quickly from the negative bias and overcurrent determination can be performed within a predetermined delay period.

The first low-pass filter (R, C1a) works in the same manner as the low-pass filter (R, C1) shown in the above embodiment 1, to prevent erroneous detection for overcurrent.

In a case where the second low-pass filter (R, C1b) is absent, i.e., the same case as in the above embodiment 1, when the semiconductor switching element 50 is ON, resistance to current noise is low with only the first low-pass filter (R, C1a) in which the capacitance of the capacitor C1a is small. However, in the present embodiment, since the second low-pass filter (R, C1b) in which the capacitance of the capacitor C1b is large is provided, erroneous detection for overcurrent due to current noise can be prevented also when the semiconductor switching element 50 is ON.

Figure 15:
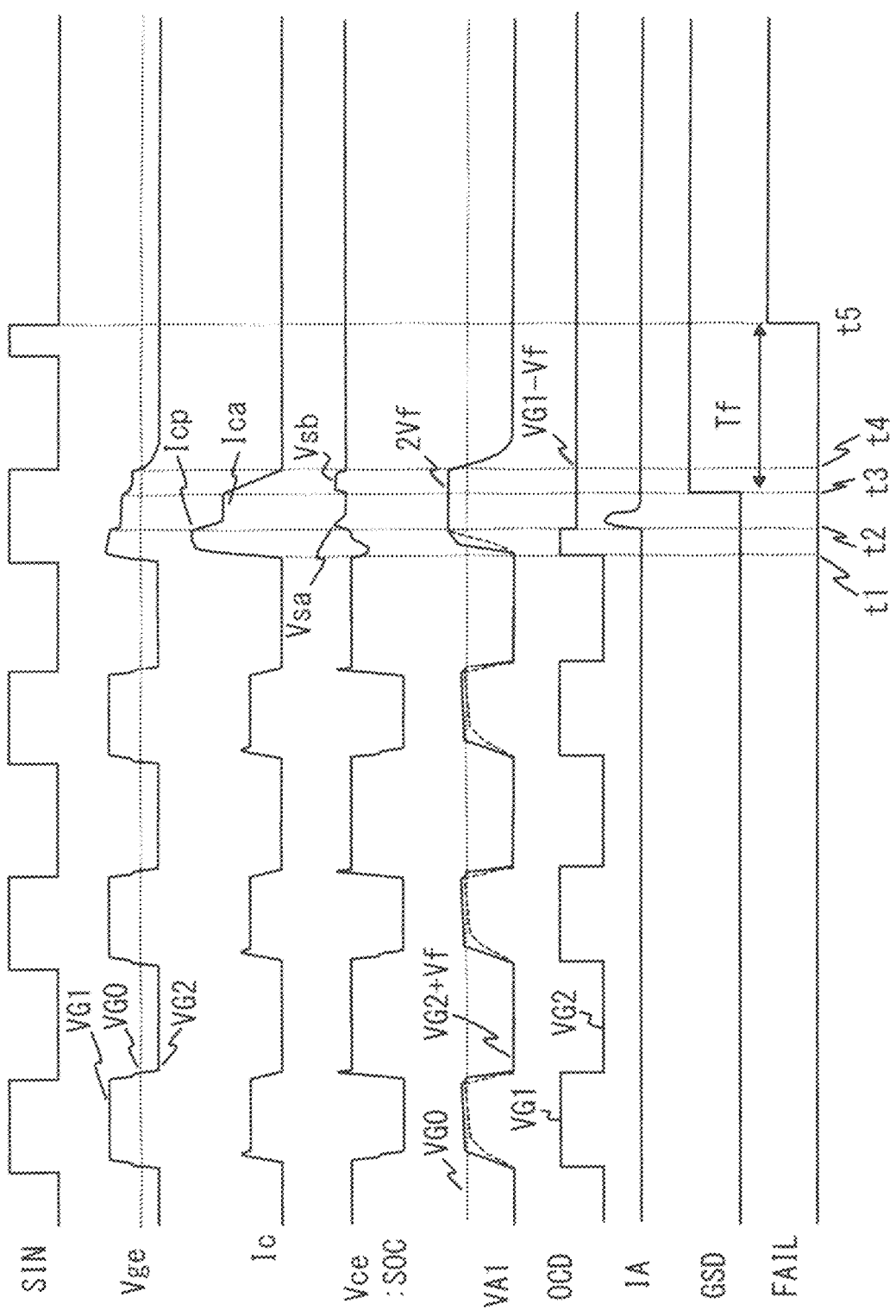
FIG. 15 is a waveform diagram at each part showing operation of the semiconductor drive device according to embodiment 7.

FIG. 15 is a waveform diagram at each part showing operation of the semiconductor drive device according to embodiment 7.

Operation waveforms other than that of the base potential (input potential) VA1 of the first transistor Q1 based on the emitter control terminal ES as a reference are the same as those shown in FIG. 3 in the above embodiment 1. The waveform of VA1 in the above embodiment 1 is indicated by a dotted line.

In a normal state before time t1, when the semiconductor switching element 50 is OFF, the base potential (input potential) VA1 of the first transistor Q1 is clamped at a potential (VG2+Vf) obtained by adding the forward-direction voltage Vf of the clamp diode D1 to the negative power supply potential VG2. When the semiconductor switching element 50 is ON, the collector voltage Vce is reduced to several V and the voltage VA1 divided by the resistor R (R1, R2, R3) and the resistor R4 becomes a value close to the reference potential VG0.

In this case, since the capacitor C1a having a small capacitance is used as the first low-pass filter (R, C1a) which is clamped by the clamp diode D1, a period taken for the base potential (input potential) VA1 to return from a negative bias when the semiconductor switching element 50 turns from on to off is shortened.

At time t1, after the semiconductor switching element 50 is turned on, when overcurrent occurs due to arm short-circuit with another connected arm, or the like, the peak value Icp of the collector current Ic is saturated and the collector voltage Vce which would be normally reduced becomes high.

Also here, after the semiconductor switching element 50 is turned on, the base potential (input potential) VA1 returns quickly from a negative bias, and further, increases beyond the reference potential VG0.

Also in the present embodiment, as in the above embodiment 1, the overcurrent protection unit 12F can, without needing supply of power for itself, detect overcurrent of the semiconductor switching element 50 using threshold voltage of the first transistor Q1 and perform protection. In addition, overcurrent protection can be performed while preventing erroneous operation due to noise, owing to actions of the clamp diode D1, the first low-pass filter (R, C1a), and the second low-pass filter (R, C1b).

Thus, even in a case where the semiconductor switching element 50 and the gate drive unit 11 of the semiconductor drive device 10 are located apart from each other, the overcurrent protection unit 12 which does not need supply of power is provided closely to the semiconductor switching element 50, whereby overcurrent protection can be performed with high reliability.

In addition, the configuration is made such that the first low-pass filter (R, C1a) is clamped at the gate potential (Vge) and the second low-pass filter (R, C1b) is not clamped at the gate potential (Vge). Thus, in an OFF state and an ON state of the semiconductor switching element 50, the first low-pass filter (R, C1a) and the second low-pass filter (R, C1b) are individually used, whereby the influence of noise can be effectively eliminated.

In addition, the capacitor C1a of the first low-pass filter (R, C1a) has a small capacitance and the capacitor C1b of the second low-pass filter (R, C1b) has a large capacitance. Thus, a period taken for the base potential (input potential) VA1 of the first transistor Q1 to return from a negative bias is shortened so that overcurrent detection can be performed quickly, and also, noise resistance can be improved.

Embodiment 8

Figure 16:
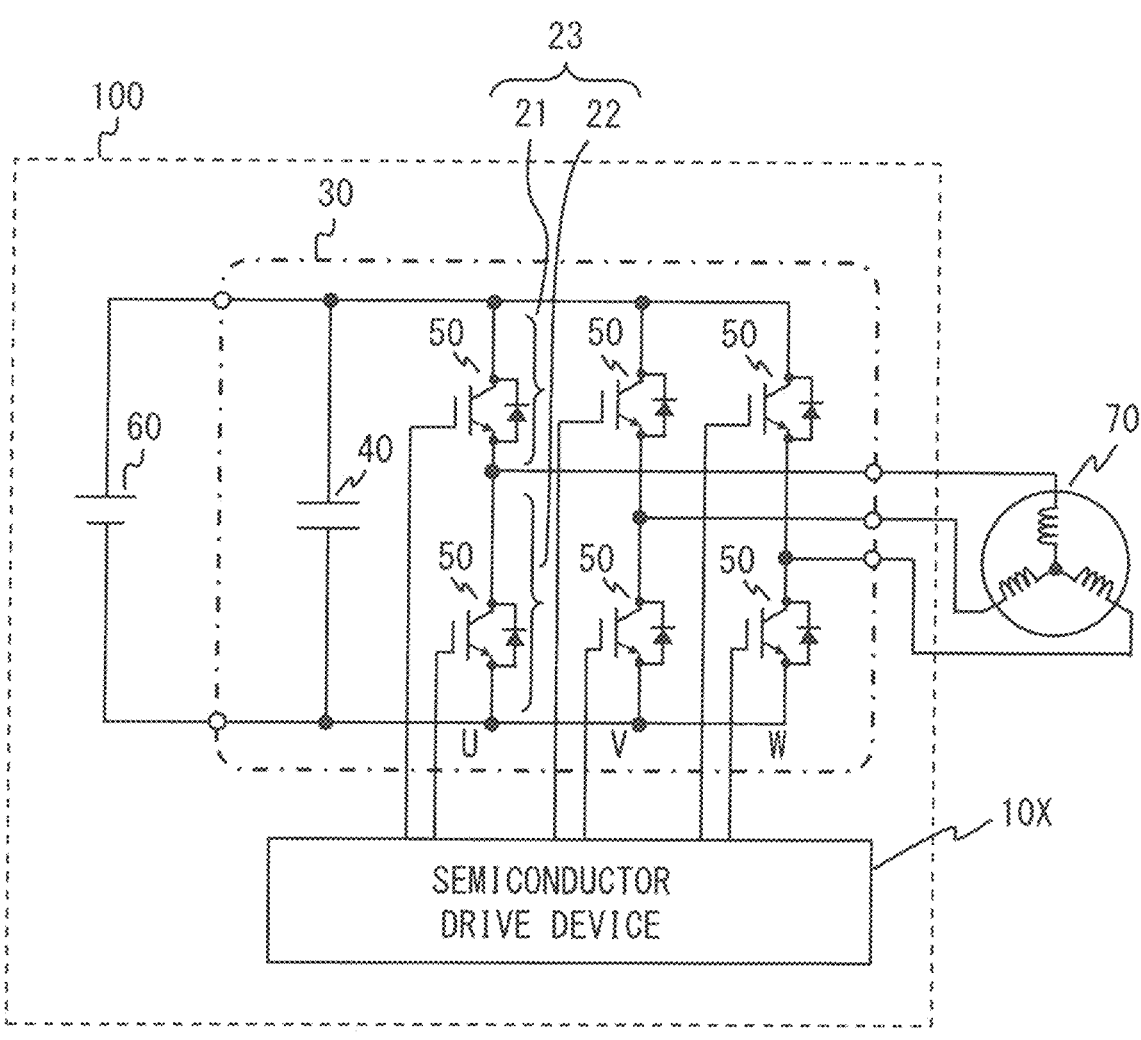
FIG. 16 shows the configuration of a power conversion device according to embodiment 8.

FIG. 16 shows the configuration of a power conversion device according to embodiment 8.

As shown in FIG. 16, a power conversion device 100 includes a power converter 30 having a plurality of semiconductor switching elements 50, and a semiconductor drive device 10X which drives each semiconductor switching element 50 in the power converter 30. In this case, the power conversion device 100 is an inverter which converts DC power from a DC power supply 60 to AC power and supplies the AC power to an AC motor 70.

The semiconductor drive device 10 according to the above embodiment 1 is provided for each of the semiconductor switching elements 50, and the individual semiconductor drive devices 10 are collectively referred to as the semiconductor drive device 10X in the present embodiment.

The power converter 30 is an inverter circuit having a three-phase (U, V, W) configuration in which a smoothing capacitor 40 and leg circuits 23 for respective phases are provided between DC buses. The leg circuit 23 for each phase is formed by connecting, in series, an upper arm 21 and a lower arm 22 each having the semiconductor switching element 50.

In the present embodiment, each semiconductor switching element 50 in the power converter 30 is driven by the semiconductor drive device 10X to which the semiconductor drive device 10 according to the above embodiment 1 is applied, whereby overcurrent protection for the semiconductor switching element 50 can be performed with high reliability without needing an additional power supply. Thus, it is possible to provide an inexpensive and highly reliable power conversion device 100 that can perform overcurrent protection for the semiconductor switching element 50 with high reliability even in a case where the semiconductor switching element 50 and the gate drive unit of the semiconductor drive device 10X are located apart from each other.

In the above description, a case where the power converter 30 outputs AC voltage at two levels that are positive and negative has been shown. However, an inverter in which any number of semiconductor switching elements 50 are connected in series and parallel so that multilevel voltage output can be performed, may be adopted. Also in this case, the power converter 30 includes the leg circuit 23 formed by connecting, in series, the upper arm 21 and the lower arm 22 each having the semiconductor switching element 50.

Figure 17:
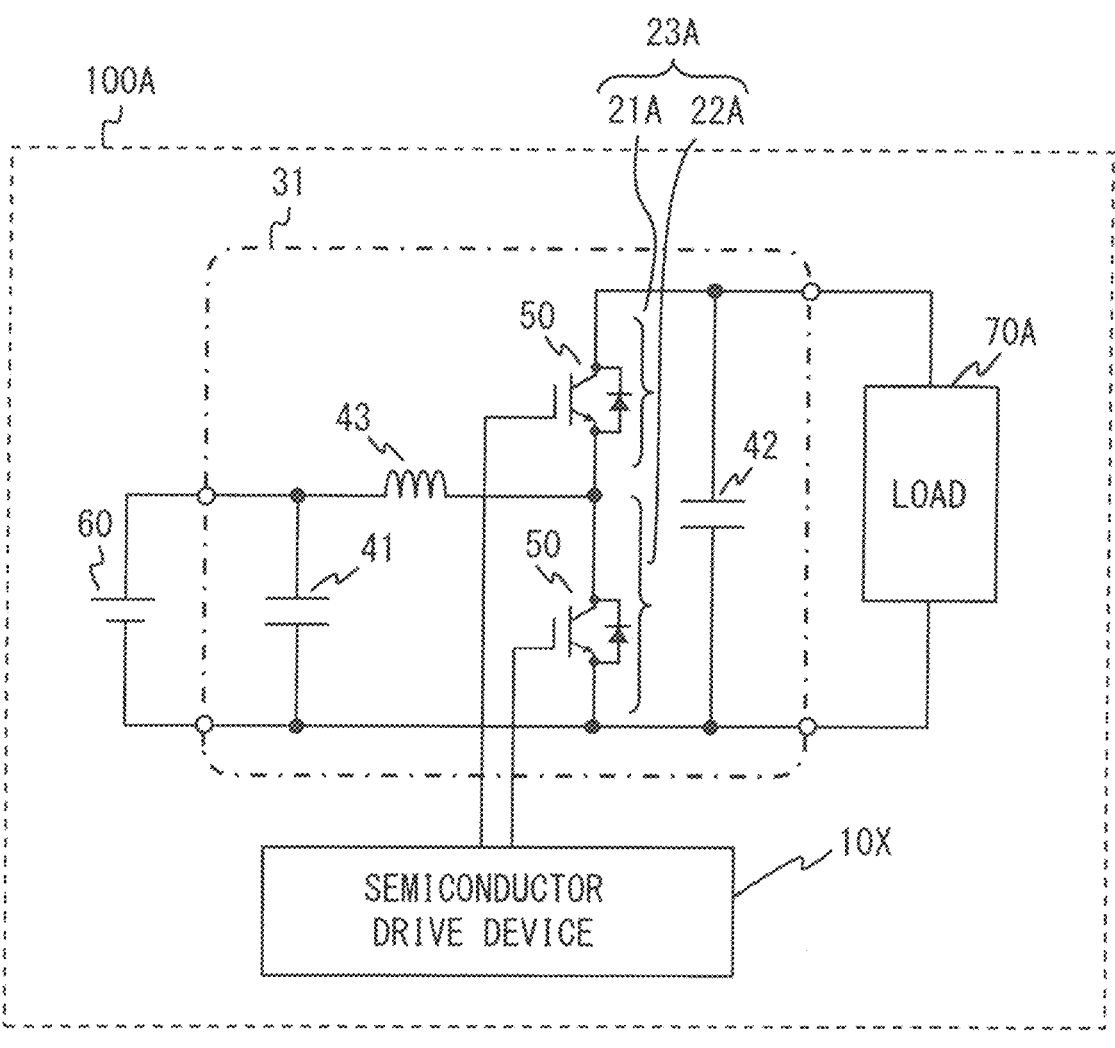
FIG. 17 shows the configuration of a power conversion device according to a first other example of embodiment 8.

Next, FIG. 17 shows the configuration of a power conversion device according to a first other example of embodiment 8.

As shown in FIG. 17, a power conversion device 100A includes a power converter 31 having a plurality of semiconductor switching elements 50, and a semiconductor drive device 10X which drives each semiconductor switching element 50 in the power converter 31. In this case, the power conversion device 100A operates as a boost converter which boosts DC voltage of the DC power supply 60 and supplies the boosted power to a DC load 70A. As described above, the semiconductor drive device 10X is a collection of individual semiconductor drive devices 10 which drive respective semiconductor switching elements 50.

The power converter 31 includes a smoothing capacitor 41 on the input side, a smoothing capacitor 42 on the output side, a leg circuit 23A, and a boost reactor 43. The leg circuit 23A is formed by connecting, in series, an upper arm 21A and a lower arm 22A each having the semiconductor switching element 50.

Also in this case, overcurrent protection for the semiconductor switching element 50 can be performed with high reliability without needing an additional power supply. Thus, it is possible to provide an inexpensive and highly reliable power conversion device 100A that can perform overcurrent protection for the semiconductor switching element 50 with high reliability even in a case where the semiconductor switching element 50 and the gate drive unit of the semiconductor drive device 10X are located apart from each other.

In the above example, the boost converter has been shown. However, a buck converter or a buck-boost converter formed by a combination of a boost converter and a buck converter is also applicable.

A wide bandgap semiconductor material may be used for the semiconductor switching element 50, whereby switching operation of the semiconductor switching element 50 can be made fast and the boost reactor 43 can be downsized. As the wide bandgap semiconductor material, silicon carbide SiC, gallium nitride, a gallium-oxide-based material, or diamond can be used.

Figure 18:
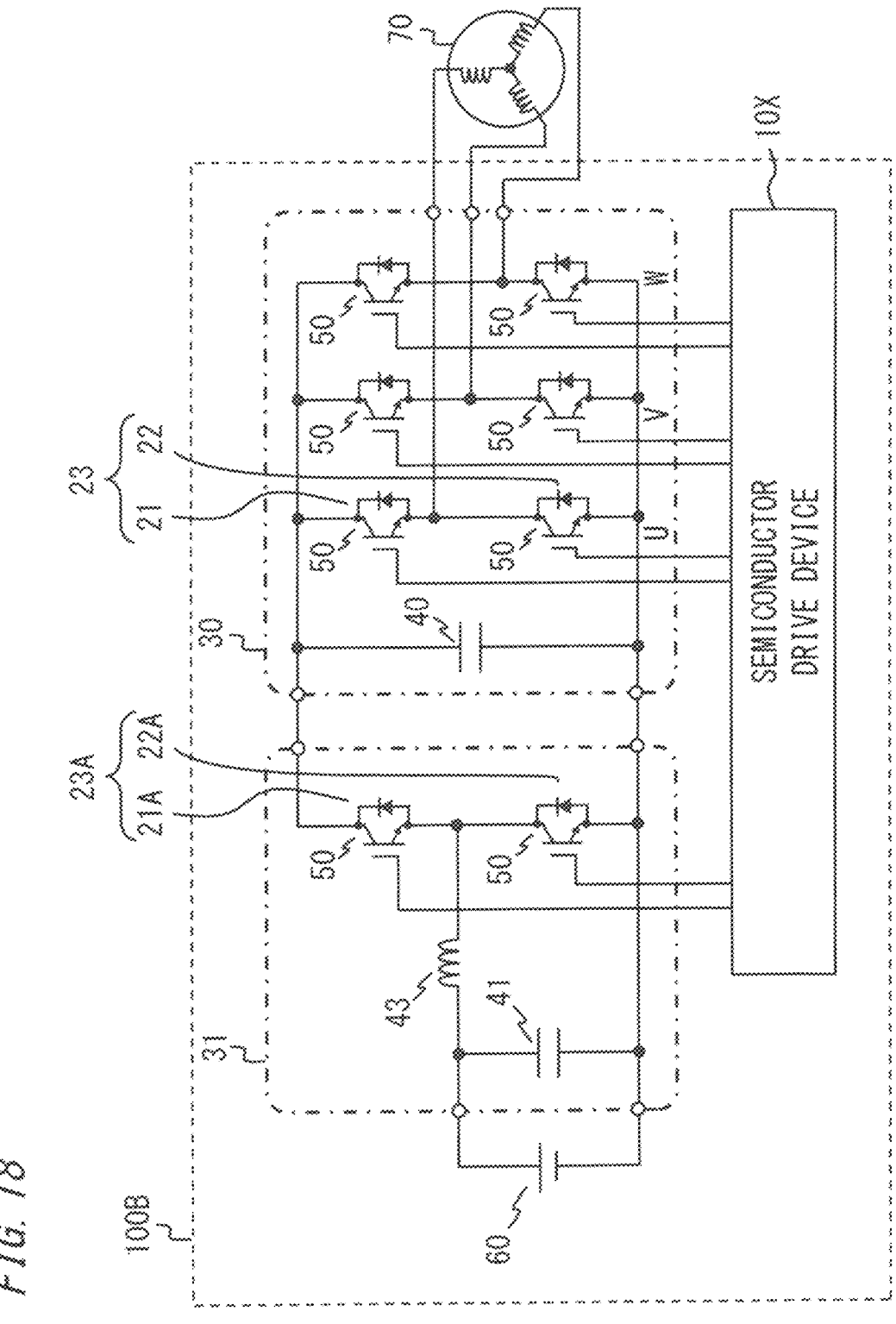
FIG. 18 shows the configuration of a power conversion device according to a second other example of embodiment 8.

Next, FIG. 18 shows the configuration of a power conversion device according to a second other example of embodiment 8.

As shown in FIG. 18, a power conversion device 100B includes a main circuit (power converter) in which the power converter 31 shown in FIG. 17 is connected to the DC side of the power converter 30 shown in FIG. 16, and the semiconductor drive device 10X which drives each semiconductor switching element 50. In this case, the power conversion device 100B boosts DC voltage of the DC power supply 60 by the power converter 31 and converts the boosted DC power to AC power by the power converter 30, and the AC power is supplied to the AC motor 70.

The power conversion device 100B operates as a boost-type inverter system, and is applied to an electric vehicle, for example.

Also in this case, overcurrent protection for the semiconductor switching element 50 can be performed with high reliability without needing an additional power supply. Thus, it is possible to provide an inexpensive and highly reliable power conversion device 100B that can perform overcurrent protection for the semiconductor switching element 50 with high reliability even in a case where the semiconductor switching element 50 and the gate drive unit of the semiconductor drive device 10X are located apart from each other.

The power converter 30 in the power conversion device 100B may be an inverter that can perform multilevel voltage output. The power converter 31 in the power conversion device 100B is not limited to the boost converter and may be a buck converter or a buck-boost converter formed by a combination of a boost converter and a buck converter.

As the semiconductor drive device 10X, the semiconductor drive device 10A to 1° F. according to each embodiment 2 to 7 other than the above embodiment 1 may be applied, whereby the same effects are provided. Also in this case, the semiconductor drive device 10X is a collection of individual semiconductor drive devices 10A to 1° F. having respective semiconductor switching elements 50.

Although the semiconductor switching elements 50 are shown as IGBTs in the drawings, the semiconductor switching elements 50 may be other semiconductor switching elements having control terminals, such as MOSFETs.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 10, 10A, 10B, 10C, 10D, 10E, 10F, 10X semiconductor drive device
11 gate drive unit
12, 12A, 12B, 12C, 12D, 12E, 12F overcurrent protection unit
13, 13A, 13B, 13C, 13D, 13E, 13F overcurrent determination unit
14, 14A gate voltage reducing unit
17 protection operation detection unit 18, 18A drive circuit
19, 19A amplification circuit
21, 21A upper arm
22, 22A lower arm
23, 23A leg circuit
30, 31 power converter
50, 50A, 50B, 50C semiconductor switching element
100, 100A, 100B power conversion device
CS collector sense terminal
CT current-voltage conversion element
D1 clamp diode
D3 reverse flow prevention diode
EE current detection terminal
ES emitter control terminal
G gate terminal
OCD determination signal
Q1 first transistor
Q2 second transistor
Q3 third transistor
VA1, VA2 input potential
R, C1 low-pass filter
R, C1$a$ first low-pass filter
R, C1$b$ second low-pass filter
SOC detection signal

The invention claimed is:

1. A semiconductor drive device comprising:
a gate drive circuitry which applies voltage to a control terminal of a semiconductor switching element, to perform ON/OFF driving of the semiconductor switching element; and
an overcurrent protection circuitry including an overcurrent determination circuitry which receives a detection signal based on voltage/current between main terminals of the semiconductor switching element and determines whether there is overcurrent flowing through the semiconductor switching element, and a gate voltage reducing circuitry which reduces voltage applied to the control terminal when it is determined that there is the overcurrent, thus protecting the semiconductor switching element, wherein
the overcurrent determination circuitry includes
a clamp diode for clamping a potential of a signal input part where the detection signal is inputted, at a potential of the control terminal,
a first transistor to which the signal input part is connected, and
a low-pass filter provided at the signal input part, and
when the potential of the signal input part has reached a set value, the first transistor is turned on, so that the overcurrent determination circuitry determines that there is the overcurrent in the semiconductor switching element.

2. The semiconductor drive device according to claim 1, wherein
when the semiconductor switching element is OFF, the clamp diode clamps the potential of the signal input part for the detection signal at the potential of the control terminal.

3. The semiconductor drive device according to claim 2, wherein
the overcurrent protection circuitry operates using, as power supply voltage, only voltage applied to the control terminal of the semiconductor switching element.

4. The semiconductor drive device according to claim 2, wherein the overcurrent determination circuitry includes a reverse flow prevention diode connected in series to the first transistor.

5. The semiconductor drive device according to claim 1, wherein the overcurrent protection circuitry operates using, as power supply voltage, only voltage applied to the control terminal of the semiconductor switching element.

6. The semiconductor drive device according to claim 5, wherein the overcurrent determination circuitry includes a reverse flow prevention diode connected in series to the first transistor.

7. The semiconductor drive device according to claim 1, wherein the overcurrent determination circuitry includes a reverse flow prevention diode connected in series to the first transistor.

8. The semiconductor drive device according to claim 1, wherein the low-pass filter provided at the signal input part includes a first low-pass filter which is clamped at the potential of the control terminal by the clamp diode, and a second low-pass filter which is not clamped at the potential of the control terminal.

9. The semiconductor drive device according to claim 8, wherein a capacitance of the second low-pass filter is larger than a capacitance of the first low-pass filter.

10. The semiconductor drive device according to claim 1, wherein when it is determined that there is the overcurrent, the gate voltage reducing circuitry keeps a state of reducing the voltage applied to the control terminal of the semiconductor switching element, during a predetermined period.

11. The semiconductor drive device according to claim 1, wherein the gate drive circuitry includes a protection operation detection circuitry for detecting that the voltage applied to the control terminal is reduced, and keeps the semiconductor switching element in an OFF state on the basis of a signal from the protection operation detection circuitry.

12. The semiconductor drive device according to claim 1, wherein the gate voltage reducing circuitry includes a drive circuit which reduces the voltage applied to the control terminal, and an amplification circuit which amplifies an output signal from the overcurrent determination circuitry, to drive the drive circuit.

13. The semiconductor drive device according to claim 12, wherein the amplification circuit of the gate voltage reducing circuitry includes a second transistor, and the drive circuit of the gate voltage reducing circuitry includes a third transistor, the first to third transistors are bipolar transistors, and when the first transistor is turned on, the second transistor is turned on and further the third transistor is turned on, so that base currents of the first, second, and third transistors are sequentially increased, and the voltage applied to the control terminal is reduced by main terminal current of the third transistor.

14. The semiconductor drive device according to claim 1, wherein the first transistor of the overcurrent determination circuitry is a bipolar transistor.

15. The semiconductor drive device according to claim 1, wherein the overcurrent determination circuitry uses the voltage between the main terminals as the detection signal.

16. The semiconductor drive device according to claim 1, wherein the semiconductor switching element has a current detection element which detects small current similar to the current between the main terminals, and the overcurrent determination circuitry uses detected current from the current detection element as the detection signal.

17. The semiconductor drive device according to claim 1, wherein the overcurrent determination circuitry uses, as the detection signal, voltage generated between a low-voltage-side main terminal and a voltage reference terminal of the semiconductor switching element.

18. The semiconductor drive device according to claim 1, wherein the overcurrent determination circuitry uses, as the detection signal, a signal obtained by detecting a change rate of current between the main terminals of the semiconductor switching element and converting the change rate to voltage.

19. A power conversion device comprising:

a power converter including at least one leg circuit formed by connecting, in series, an upper arm and a lower arm each having the semiconductor switching element; and the semiconductor drive device according to claim 1, provided for each of the semiconductor switching elements, to drive the semiconductor switching element.

20. The power conversion device according to claim 19, wherein the semiconductor switching element is a wide bandgap semiconductor made from any semiconductor material of silicon carbide, gallium nitride, a gallium-oxide-based material, or diamond.

* * * * *